US012527178B2

(12) United States Patent
Huang et al.

(10) Patent No.: US 12,527,178 B2
(45) Date of Patent: Jan. 13, 2026

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yao Huang, Beijing (CN); Binyan Wang, Beijing (CN); Yuanyou Qiu, Beijing (CN); Cong Liu, Beijing (CN); Chao Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 595 days.

(21) Appl. No.: 17/921,269

(22) PCT Filed: Oct. 28, 2021

(86) PCT No.: PCT/CN2021/127145
§ 371 (c)(1),
(2) Date: Oct. 25, 2022

(87) PCT Pub. No.: WO2022/222407
PCT Pub. Date: Oct. 27, 2022

(65) Prior Publication Data
US 2024/0224641 A1   Jul. 4, 2024

(30) Foreign Application Priority Data
Apr. 23, 2021   (CN) .......................... 202110443185.3

(51) Int. Cl.
*H10K 59/131* (2023.01)
*H10K 59/00* (2023.01)
(Continued)

(52) U.S. Cl.
CPC ....... *H10K 59/131* (2023.02); *H10K 59/1213* (2023.02); *H10K 59/88* (2023.02); *H10K 59/00* (2023.02)

(58) Field of Classification Search
CPC .. H10K 59/131; H10K 59/88; H10K 59/1213; H10K 59/00
See application file for complete search history.

(56) References Cited

U.S. PATENT DOCUMENTS 11,211,012 B2 * 12/2021 Hao ..................... G09G 3/3266
11,721,280 B2 *  8/2023 Chen .................. H10K 59/8791
                                                             345/211
(Continued)

FOREIGN PATENT DOCUMENTS

CN       110400521 A      11/2019
CN       110853512 A       2/2020
(Continued)

OTHER PUBLICATIONS

China National Intellectual Property Administration, First office action of Chinese application No. 202110443185.3 issued on Dec. 9, 2024, which is foreign counterpart application of this US application, 21 pages.

*Primary Examiner* — Vinh T Lam
(74) *Attorney, Agent, or Firm* — XSENSUS LLP

(57) ABSTRACT

Provided is a display panel. The display panel includes a base substrate, a plurality of dummy electrode patterns and a plurality of first connection traces. The dummy electrode patterns are disposed in a first display region of the base substrate, and the dummy electrode patterns and the first connection traces are disposed in different layers.

20 Claims, 24 Drawing Sheets

(51) Int. Cl.
*H10K 59/121* (2023.01)
*H10K 59/88* (2023.01)

(56) References Cited

U.S. PATENT DOCUMENTS

| | | | | |
|---|---|---|---|---|
| 11,737,325 | B2* | 8/2023 | Yang | H10K 59/1213 257/71 |
| 11,810,504 | B2* | 11/2023 | Cheng | H10K 59/351 |
| 11,847,964 | B2* | 12/2023 | Huang | G09G 3/3275 |
| 11,862,081 | B2* | 1/2024 | Cheng | H10K 59/351 |
| 11,863,853 | B2* | 1/2024 | Ye | H04M 1/0266 |
| 12,022,701 | B2* | 6/2024 | Du | G09G 3/3225 |
| 12,131,695 | B2* | 10/2024 | Cheng | H10K 71/621 |
| 12,133,430 | B2* | 10/2024 | Yang | H10K 59/88 |
| 12,133,449 | B2* | 10/2024 | He | G09G 3/3233 |
| 12,150,352 | B2* | 11/2024 | Liu | H10K 59/131 |
| 12,156,446 | B2* | 11/2024 | Du | H10K 59/131 |
| 12,193,282 | B2* | 1/2025 | Zhang | G09G 3/3233 |
| 12,207,528 | B2* | 1/2025 | Huang | G09G 3/3233 |
| 12,250,866 | B2* | 3/2025 | Song | H10D 86/60 |
| 12,272,776 | B2* | 4/2025 | Wu | G09G 3/32 |
| 2019/0172875 | A1 | 6/2019 | Kang et al. | |
| 2020/0034598 | A1 | 1/2020 | Wu et al. | |
| 2022/0045155 | A1 | 2/2022 | Ma et al. | |
| 2022/0123094 | A1 | 4/2022 | Qiu et al. | |
| 2022/0157895 | A1 | 5/2022 | Xu et al. | |
| 2022/0262889 | A1* | 8/2022 | Song | H10K 59/1201 |
| 2022/0285470 | A1 | 9/2022 | Qiu et al. | |
| 2022/0293715 | A1* | 9/2022 | Du | H10K 59/131 |
| 2022/0310746 | A1 | 9/2022 | Huang et al. | |
| 2022/0320146 | A1 | 10/2022 | Huang et al. | |
| 2023/0165052 | A1* | 5/2023 | Liu | H10K 59/122 257/40 |
| 2023/0389374 | A1* | 11/2023 | Huang | H10K 77/10 |
| 2024/0016010 | A1* | 1/2024 | Huang | H10K 59/121 |
| 2024/0224641 | A1* | 7/2024 | Huang | H10K 59/131 |
| 2025/0037661 | A1* | 1/2025 | Long | H10K 59/1213 |

FOREIGN PATENT DOCUMENTS

| | | |
|---|---|---|
| CN | 111048005 A | 4/2020 |
| CN | 111211150 A | 5/2020 |
| CN | 111326560 A | 6/2020 |
| CN | 111446282 A | 7/2020 |
| CN | 111477676 A | 7/2020 |
| CN | 111584757 A | 8/2020 |
| CN | 111785742 A | 10/2020 |
| CN | 111785853 A | 10/2020 |
| CN | 112038380 A | 12/2020 |
| CN | 112117320 A | 12/2020 |
| CN | 112466209 A | 3/2021 |
| CN | 215266306 U | 12/2021 |
| EP | 3599644 A1 | 1/2020 |
| KR | 20160073531 A | 6/2016 |

* cited by examiner

DISPLAY PANEL AND DISPLAY APPARATUS

CROSS-REFERENCE TO RELATED APPLICATION

This application is a U.S. national stage of international application No. PCT/CN2021/127145, fled on Oct. 28, 2021, which claims priority to Chinese Patent Application No. 202110443185.3, filed on Apr. 23, 2021, and entitled "DISPLAY PANEL AND DISPLAY APPARATUS," the disclosures of which are incorporated herein by reference in their entireties.

TECHNICAL FIELD

The present disclosure relates to the field of display technologies, and in particular, relates to a display panel and a display apparatus.

BACKGROUND

Organic light-emitting diode (OLED) display panels have been widely used because of the advantages such as self-luminescence, low driving voltage, and high response speed. The OLED display panel includes a plurality of pixel units, and each of the pixel units includes a light-emitting unit and a pixel circuit unit connected to the light-emitting unit.

SUMMARY

The present disclosure provides a display panel and display apparatus. The technical solutions are as follows.

In some embodiments of the present disclosure, a display panel is provided. The display panel includes:
- a base substrate including a first display region and a second display region, the first display region and the second display region being adjacent to each other;
- a plurality of first light-emitting units disposed in the first display region;
- a plurality of first pixel circuit groups disposed in the first display region, each of the first pixel circuit groups being electrically connected to at least one of the first light-emitting units;
- a plurality of second light-emitting units disposed in the second display region;
- a plurality of second pixel circuit groups disposed in the first display region;
- a plurality of dummy electrode patterns disposed in the first display region; and
- a plurality of first connection traces, at least one of the first connection traces having one end electrically connected to at least one of the second light-emitting units, and having the other end electrically connected to the dummy electrode patterns and the second pixel circuit groups;
- wherein the first connection traces and the dummy electrode patterns are disposed in different layers.

Optionally, the display panel further includes: a plurality of second connection traces; wherein at least one of the second connection traces has one end electrically connected to at least one of the second light-emitting units, and has the other end electrically connected to the dummy electrode patterns and the second pixel circuit groups; and the second connection traces, the first connection traces, and the dummy electrode patterns are disposed in different layers.

Optionally, a sum of numbers of the first and second connection traces in the display panel is equal to a number of the dummy electrode patterns, the first connection traces and the second connection traces are in one-to-one correspondence with the dummy electrode patterns, and each of the first and second connection traces is electrically connected to a corresponding dummy electrode pattern of the dummy electrode patterns.

Optionally, at least one of the dummy electrode patterns includes a main body portion and a first connection portion, the first connection portion extending in a first direction, and both the first connection traces and the second connection traces extend in a second direction, the first direction being intersected with the second direction; wherein the first connection portion is electrically connected, at an intersection of the first connection portion and at least one of the first and second connection traces, to the at least one of the first and second connection traces by a via.

Optionally, each of the second pixel circuit groups includes: a source-drain metal layer disposed on the base substrate, the source-drain metal layer including a source and a drain spaced apart; and the display panel further includes: a first insulation layer, a second insulation layer and a third insulation layer; wherein the source-drain metal layer, the first insulation layer, the first connection traces, the second insulation layer, the second connection traces, the third insulation layer, and the dummy electrode patterns are sequentially stacked in a direction going away from the base substrate.

Optionally, the dummy electrode patterns at least include: a first dummy electrode pattern and a second dummy electrode pattern; the second insulation layer is provided with a plurality of first vias and a plurality of second vias, and the third insulation layer is provided with a plurality of third vias and a plurality of fourth vias, the third vias being in one-to-one correspondence with the first vias, and the fourth vias being in one-to-one correspondence with the second vias; wherein an orthographic projection of each of the first vias on the base substrate is at least partially overlapped with an orthographic projection of the corresponding third via on the base substrate, each of the first vias is configured to expose one of the first connection traces, and at least part of the first connection portion in the first dummy electrode pattern is electrically connected to the first connection trace by the third via and the first via; and each of the second connection traces is at least partially disposed within the second vias, each of the fourth vias is configured to expose one of the second connection traces, and at least part of the first connection portion in the second dummy electrode patterns is electrically connected to the second connection trace by the fourth via.

Optionally, an orthographic projection of the intersection on the base substrate is overlapped with an orthographic projection of the first connection portion on the base substrate.

Optionally, the display panel further includes: a plurality of second connection portions, wherein the second connection portions extend in a first direction, the first connection traces and the second connection traces both extend in a second direction, and the first direction is intersected with the second direction; and the second connection portions and the dummy electrode patterns are disposed in different layers, the second connection portions are electrically connected to one of the dummy electrode patterns by a via, and the second connection portions are further electrically connected, at an intersection of the second connections and at least one of the first and second connection traces, to the at least one of the first and second connection traces by a via.

Optionally, each of the second pixel circuit groups includes: a source-drain metal layer disposed on the base substrate, the second connection portions and the source-drain metal layer being disposed in a same layer.

Optionally, the display panel further includes: a first insulation layer, a second insulation layer and a third insulation layer; wherein the source-drain metal layer, the first insulation layer, the first connection traces, the second insulation layer, the second connection traces, the third insulation layer, and the dummy electrode patterns are sequentially stacked in a direction going away from the base substrate.

Optionally, the first insulation layer is provided with a plurality of fifth vias, wherein each of the fifth vias is configured to expose one of the second connection portions, and at least part of one of the first connection traces is electrically connected to the second connection portion by one of the fifth vias; and the first insulation layer and the second insulation layer are provided with a plurality of sixth vias, wherein each of the sixth vias is configured to expose one of the second connection portions, and at least part of one of the second connection traces is electrically connected to the second connection portion by one of the sixth vias.

Optionally, an orthographic projection of the intersection on the base substrate is not overlapped with an orthographic projection of any one of the dummy electrode patterns on the base substrate; or an orthographic projection of the intersection on the base substrate is within an orthographic projection of one of the dummy electrode patterns on the base substrate.

Optionally, each of the second pixel circuit groups includes: a source-drain metal layer disposed on the base substrate, the source-drain metal layer including a source and a drain spaced apart; and the display panel further includes: a first insulation layer, a second insulation layer and a third insulation layer; wherein the source-drain metal layer, the first insulation layer, the first connection traces, the second insulation layer, the second connection traces, the third insulation layer, and the dummy electrode patterns are sequentially stacked in a direction going away from the base substrate; the second insulation layer being provided with a plurality of seventh vias and a plurality of eighth vias, and the third insulation layer being provided with a plurality of ninth vias and a plurality of tenth vias, the ninth vias being in one-to-one correspondence with the seventh vias, and the tenth vias being in one-to-one correspondence with the eighth vias; wherein an orthographic projection of each of the seventh vias on the base substrate is at least partially overlapped with an orthographic projection of the corresponding ninth via on the base substrate, each of the seventh vias is configured to expose one of the first connection traces, and a first electrode of at least one of the second light-emitting units is electrically connected to the first connection trace by the seventh via and the ninth via; and each of the second connection traces is at least partially disposed within the eighth vias, each of the tenth vias being configured to expose one of the second connection traces, and a first electrode of at least one of the second light-emitting units is electrically connected to the second connection trace by the tenth via.

Optionally, the first insulation layer is provided with a plurality of eleventh vias, the second insulation layer is provided with a plurality of twelfth vias, the twelfth vias being in one-to-one correspondence with the eleventh vias, and the third insulation layer is provided with a plurality of thirteenth vias, the thirteenth vias being in one-to-one correspondence with the twelfth vias; wherein an orthographic projection of each of the eleventh vias on the base substrate is at least partially overlapped with an orthographic projection of the corresponding twelfth via on the base substrate, and an orthographic projection of each of the twelfth vias on the base substrate is at least partially overlapped with an orthographic projection of the corresponding thirteenth via on the base substrate; and the display panel further includes: a plurality of first connection patterns and a plurality of second connection patterns, the second connection patterns being in one-to-one correspondence with the first connection patterns; wherein each of the eleventh vias is configured to expose a drain of a transistor in one of the second pixel circuit groups, and at least part of one of the first connection patterns is electrically connected to the drain by the eleventh via; each of the twelfth vias is configured to expose one of the first connection patterns, and at least part of one of the second connection patterns corresponding to one of the first connection patterns is electrically connected to the first connection pattern by the twelfth via; and each of the thirteenth vias is configured to expose one of the second connection patterns, and at least part of one of the dummy electrode patterns is connected to the second connection pattern by the thirteenth via; wherein the first connection patterns and the first connection traces are disposed in the same layer, and the second connection patterns and the second connection traces are disposed in a same layer.

Optionally, orthographic projections of the first connection traces on the base substrate are not overlapped with orthographic projections of the second connection traces on the base substrate.

Optionally, the orthographic projections of the first connection traces on the base substrate and the orthographic projections of the second connection traces on the base substrate are alternately arranged in a second direction of the display panel.

Optionally, the base substrate includes: two first display regions, the two first regions being disposed on either side of the second display region in a first direction; the base substrate further includes: a first peripheral region and a second peripheral region, the first peripheral region and the second peripheral region being disposed on either side of the two first display regions; the display panel further includes: a first row-drive circuit disposed in the first peripheral region and a second row-drive circuit disposed in the second peripheral region; wherein the first row-drive circuit is electrically connected to the first and second pixel circuit groups in one of the first display regions, and the second row-drive circuit is electrically connected to the first and second pixel circuit groups in the other first display region.

Optionally, the display panel further includes: a plurality of first scanning signal lines disposed in one of the first display regions, and a plurality of second scanning signal lines disposed in the other first display region; wherein the first row-drive circuit is electrically connected to the first and second pixel circuit groups in one of the first display regions by the first scanning signal lines, and the second row-drive circuit is electrically connected to the first and second pixel circuit groups in the other first display region by the second scanning signal lines; and the first scanning signal lines and the second scanning signal lines are disposed in a same layer, and both orthographic projections of the first scanning signal lines on the base substrate and orthographic projections of the second scanning signal lines on the base substrate are outside the second display region.

Optionally, the base substrate further includes: a third display region disposed on a same side as the first display regions and the second display region; the first peripheral region and the second peripheral region are disposed on either side of the third display region in a first direction, the display panel further includes: a plurality of third light-emitting units disposed in the third display region, and a plurality of third pixel circuit groups connected to the third light-emitting units in one-to-one correspondence; and the first row-drive circuit and the second row-drive circuit are both connected to the third pixel circuit groups in the third display region.

Optionally, a density of the third light-emitting units is greater than a density of the first light-emitting units, and greater than a density of the second light-emitting units.

Optionally, a shape of the second display region is a rectangle; the display panel further includes: a plurality of data lines; wherein an orthographic projection of a portion, disposed in the second display region, of each of the data lines on the base substrate is a straight line or a broken line, and is within a region of the second display region close to the first display region.

Optionally, each of the second light-emitting units includes: a first electrode, a light-emitting layer and a second electrode, which are sequentially stacked in a direction going away from the base substrate; wherein the dummy electrode patterns and the first electrode are disposed in a same layer.

Optionally, an orthographic projection of each of the dummy electrode patterns on the base substrate is at least partially overlapped with an orthographic projection of at least one of the second pixel circuit groups on the base substrate, and the orthographic projection of each of the dummy electrode patterns on the base substrate is not overlapped with an orthographic projection of any one of the first light-emitting units on the base substrate.

Optionally, an orthographic projection of a connection of each of the dummy electrode patterns and the second pixel circuit groups on the base substrate is not overlapped with orthographic projections of a plurality of first connection traces on the base substrate, and not overlapped with orthographic projections of a plurality of second connection traces on the base substrate.

In some embodiments of the present disclosure, a display apparatus is provided. The display apparatus includes: a power supply assembly, and a display panel as defined in the above aspect, wherein the power supply assembly is configured to supply power to the display panel.

BRIEF DESCRIPTION OF THE DRAWINGS

For clearer illustration of the technical solutions in embodiments of the present disclosure, accompanying drawings required for describing the embodiments are briefly introduced hereinafter. Apparently, the accompanying drawings described hereinafter merely illustrate some embodiments of the present disclosure, and those ordinary skilled in the art may derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In other practices, a camera of a display apparatus is disposed in a display region of a display panel to increase the screen-to-body ratio of the display panel. Moreover, pixel circuits of each light-emitting unit in a region where the camera is disposed are usually arranged in a non-camera region to increase transmittance of the region where the camera is disposed. The pixel circuits disposed in the non-camera region are connected, by connection traces, to the light-emitting units disposed in a camera region, thereby providing drive signals for the light-emitting units disposed in the camera region.

However, due to inconsistent overlap capacitances between the regions, where the pixel circuits are disposed in the non-camera region, and the connection traces, display effect of the display panel is poor.

Terms used in the embodiments of the present disclosure are only for the purpose of illustrating the embodiments of the present disclosure, and not intended to limit the present disclosure. Unless otherwise defined, technical or scientific terms used in the embodiments of the present disclosure have the ordinary meanings as understood by those ordinary skilled in the art to which the present disclosure belongs. Terms "first," "second," "third" and the like used in the description and claims of the present disclosure do not denote any order, quantity, or importance, but are merely used to distinguish different components. Similarly, the terms "a," "an," or the like are also not intended to limit the number, but to denote the number of at least one. The terms "comprise," "include," or the like are intended to mean that elements or objects appearing before said term cover elements or objects or equivalents listed after said term, but do not exclude other elements or objects. The terms "connect." "couple," or the like are not limited to physical or mechanical connections, but include electrical connections, regardless of direct or indirect connections. The terms "up," "down," "left," "right," or the like are only used to indicate a relative positional relationship, and when the absolute position of a described object changes, the relative positional relationship thereof also change accordingly.

Figure 1:
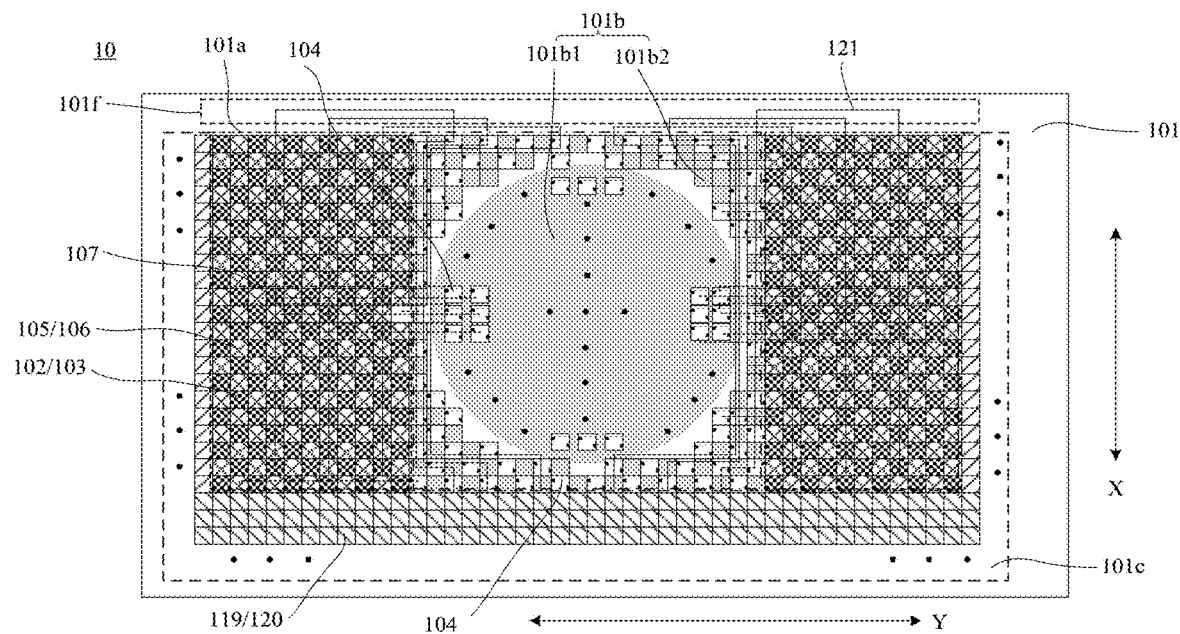
FIG. 1 is a schematic diagram of a structure of a display panel according to some embodiments of the present disclosure.
Figure 2:
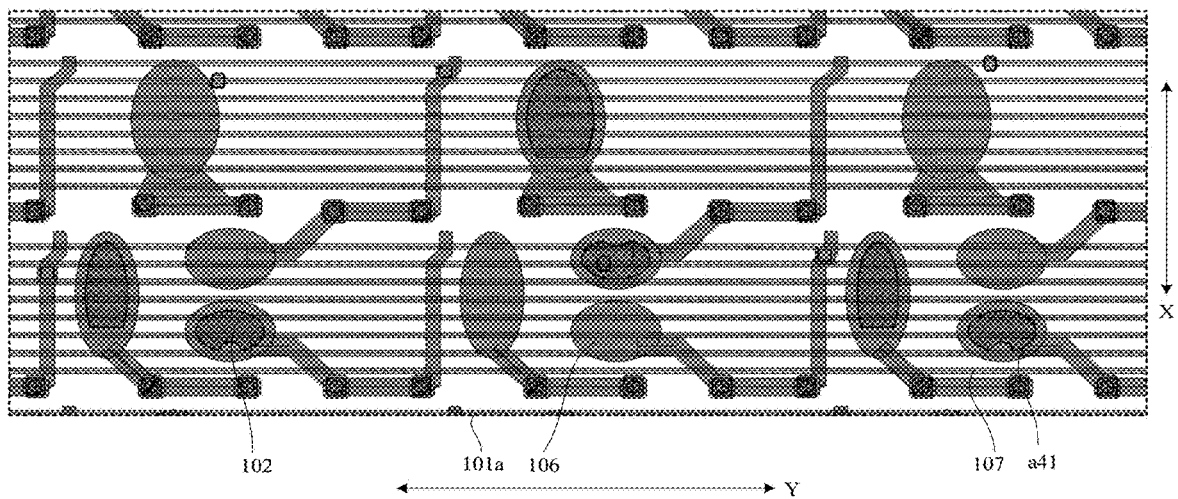
FIG. 2 is a partial schematic diagram of a display panel according to some embodiments of the present disclosure.

FIG. 1 is a schematic diagram of a structure of a display panel according to some embodiments of the present disclosure. FIG. 2 is a partial schematic diagram of a display panel according to some embodiments of the present disclosure. In combination with FIG. 1 and FIG. 2, the display panel 10 includes: a base substrate 101, a plurality of first light-emitting units 102, a plurality of first pixel circuit groups 103, a plurality of second light-emitting units 104, a plurality of second pixel circuit groups 105, a plurality of dummy electrode patterns 106 and a plurality of first connection traces 107. Individual pixel circuit groups are not shown in FIG. 2.

Figure 3:
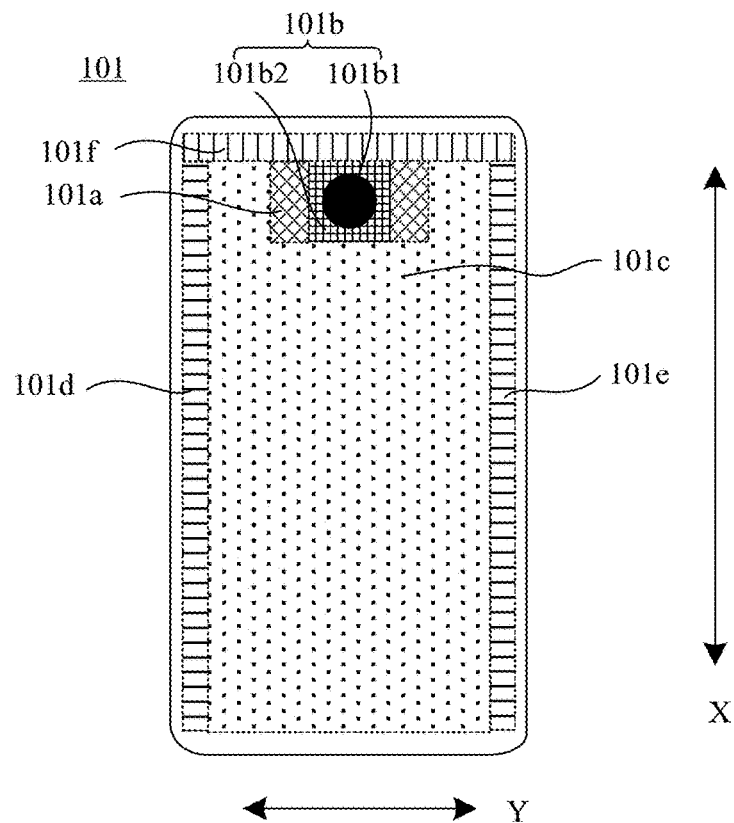
FIG. 3 is a top view of a base substrate according to some embodiments of the present disclosure.

FIG. 3 is a top view of a base substrate according to some embodiments of the present disclosure. Referring to FIG. 3, the base substrate 101 includes a first display region 101a and a second display region 101b, the first display region 101a and the second display region 101b being adjacent to each other. FIG. 3 shows two first display regions 101a and one second display region 101b. The second display region 101b is a region where a camera is disposed.

In combination with FIG. 1 to FIG. 3, the first light-emitting units 102 are disposed in the first display region 101a, and the first pixel circuit groups 103 are disposed in the first display region 101a. Each of the first pixel circuit groups 103 is connected to at least one of the first light-emitting units 102, and each of the first pixel circuit groups 103 is configured to provide a drive signal to at least one of the first light-emitting units 102 connected thereto, the drive signal being configured to drive the first light-emitting unit 102 to emit light.

Moreover, in combination with FIG. 1 to FIG. 3, the second light-emitting units 104 are disposed in the second display region 101b, and the second pixel circuit groups 105 are disposed in the first display region 11a. The dummy electrode patterns 106 are disposed in the first display region 101a. At least one of the first connection traces 107 has one end electrically connected to at least one of the second light-emitting units 104, and has the other end electrically connected to the dummy electrode patterns 106 and the second pixel circuit groups 105. That is, each of the first connection traces 107 has one end disposed in the second display region 101b, and has the other end disposed in the first display region 101a. In this way, the second pixel circuit groups 105 disposed in the first display region 101a is electrically connected to the second light-emitting units 104 disposed in the second display region 101b, such that the second pixel circuit groups 105 provide drive signals to the second light-emitting units 104 connected thereto. The drive signals are configured to drive the second light-emitting units 104 to emit light.

In the embodiments of the present disclosure, the first connection traces 107 and the dummy electrode patterns 106 are disposed in different layers. That is, the first connection traces 107 and the dummy electrode patterns 106 are prepared by two patterning processes.

Because the dummy electrode patterns 106 are disposed in the first display region 101a, overlap capacitances between regions, where the first light-emitting units 102 are disposed in the first display region 101a, and the first connection traces 107 are consistent with overlap capacitances between regions, where the dummy electrode patterns 106 are disposed, and the first connection traces 107, thereby guaranteeing the display effect of the display panel 10.

In summary, the embodiments of the present disclosure provide a display panel. The first display region in the display panel is provided with dummy electrode patterns, the dummy electrode patterns being disposed in a layer different from that of first connection traces. In this way, consistent overlap capacitances between regions, where the pixel circuit groups are disposed in the first display region, and the first connection traces are achieved conveniently, such that the display effect of the display panel is guaranteed.

Figure 4:
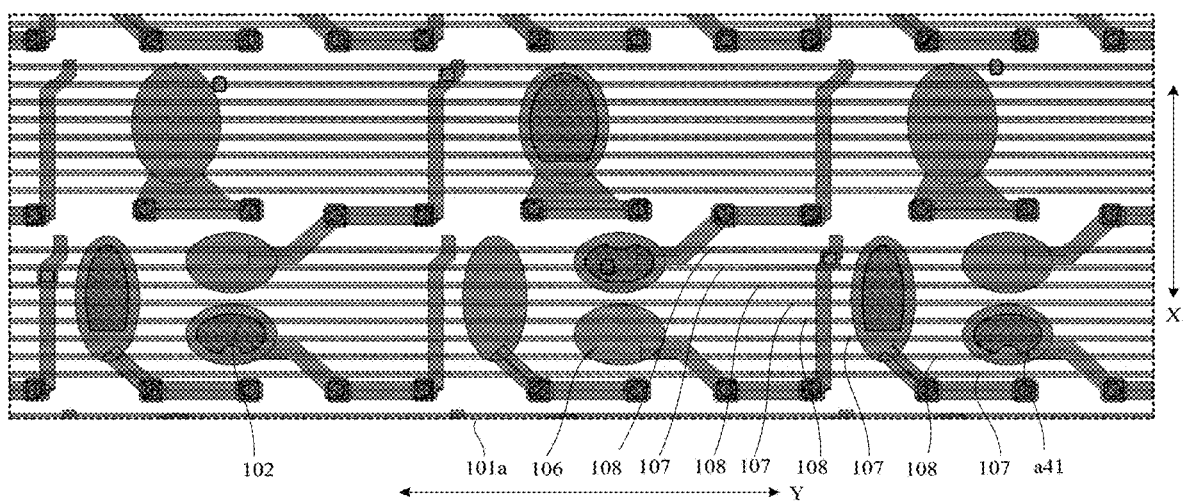
FIG. 4 is a partial schematic diagram of another display panel according to some embodiments of the present disclosure.

FIG. 4 is a partial schematic diagram of another display panel according to some embodiments of the present disclosure. Referring to FIG. 4, the display substrate 10 further includes: a plurality of second connection traces 108. At least one of the second connection traces 108 has one end electrically connected to at least one of the second light-emitting units 104, and has the other end electrically connected to the dummy electrode patterns 106 and the second pixel circuit groups 105.

The second connection traces 108, the first connection traces 107, and the dummy electrode patterns 106 are disposed in different layers. That is, any two of the following structures are disposed in different layers: the first connection traces 107, the second connection traces 108, and the dummy electrode patterns 106. The first connection traces 107, the second connection traces 108, and the dummy electrode patterns 106 need to be prepared by three patterning processes.

Due to limited space of the display panel 10, the number of the first connection traces 107 that are disposed in the same layer is limited. Therefore, by disposing the first connection traces 107 and the second connection traces 108 in different layers, some of the second pixel circuit groups 105 in the first display region 101a are connected, by the first connection traces 107, to some of the second light-emitting units 104 in the second display region 101b, such that these second light-emitting units 104 disposed in the second display region 101b are driven to emit light. Moreover, other second pixel circuit groups 105 in the first display region 101a are connected, by the second connection traces 108, to other second light-emitting units 104 in the second display region 101b, such that these second light-emitting units 104 disposed in the second display region 101b are driven to emit light.

According to the solution of the embodiments of the present disclosure, the number of the second light-emitting units 104 that are disposed in the second display region 101b is increased without increasing the number of the first connection traces 107, thereby guaranteeing a display effect of the second display region 101b in the display panel 10. Moreover, a large number of second light-emitting units 104 are disposed in the second display region 101b, such that the second display region 101b allows the arrangement of a large-size camera, manufacturing accuracy requirement with respect to the display panel 10 is low.

Optionally, the first connection traces 107 and the second connection traces 108 are made of a transparent material to avoid influence of the first connection traces 107 and the second connection traces 108 on the transmittance of the second display region 101b. Exemplarily, the first connection traces 107 and the second connection traces 108 are made of indium tin oxide (ITO). In addition, the first connection traces 107 and the second connection traces 108 both extend in a second direction Y. The second direction Y is the pixel row direction of the display panel 10.

In should be noted that, in some embodiments of the present disclosure, the display panel 10 further includes a plurality of third connection traces. Moreover, any two of the following structures are disposed in different layers: the first connection traces 107, the second connection traces 108, the third connection traces and the dummy electrode patterns 106. The first connection traces 107, the second connection traces 108, the third connection traces and the dummy electrode patterns 106 need to be prepared by four patterning processes. That is, the display panel 10 includes connection traces in three layers, namely, the first connection traces 107, the second connection traces 108, and the third connection traces. The display panel 10 further includes connection traces in more layers, which is not limited in the embodiments of the present disclosure.

In the embodiments of the present disclosure, the display panel 10 including connection traces in two layers is taken as an example. That is, the display panel 10 includes the first connection traces 107 and the second connection traces 108. A sum of the numbers of the first and second connection traces 107 and 108 in the display panel 10 is equal to the number of the dummy electrode patterns 106 in the display panel 10. And the first connection traces 107 and the second connection traces 108 are in one-to-one correspondence with the dummy electrode patterns 106. Each of the first and second connection traces 107 and 108 is electrically connected to a corresponding dummy electrode pattern 106 of the dummy electrode patterns 106.

In the embodiments of the present disclosure, referring to FIG. 1, an orthographic projection of each of the dummy electrode patterns 106 on the base substrate 101 is at least partially overlapped with an orthographic projection of at least one of the second pixel circuit groups 105 on the base substrate 101. In FIG. 1, two overlapping structures are represented by the same small block. For example, the first light-emitting unit 102 and the first pixel circuit group 103, which are overlapped with each other, are represented by the same small block and marked with 102/103. For another example, the second pixel circuit group 105 and the dummy electrode pattern 106, which are overlapped with each other, are represented by the same small block and marked with 105/106. Optionally, an orthographic projection of each of the dummy electrode patterns 106 on the base substrate 101 is at least partially overlapped with the orthographic projection of one of the second pixel circuit groups 105 on the base substrate 101.

Moreover, the orthographic projection of each of the dummy electrode patterns 106 on the base substrate 101 is not overlapped with the orthographic projection of any one of the first light-emitting units 102 on the base substrate 101. Because the dummy electrode patterns 106 are not overlapped with the first light-emitting units 102, influence of the dummy electrode patterns 106 on the first light-emitting units 102 is avoided, thereby guaranteeing the light-emitting effect of the first light-emitting units 102.

In some embodiments of the present disclosure, referring to FIG. 1 and FIG. 3, the second display region 101b includes a center region 101b1 and an edge region 101b2 surrounding the center region 101b1. For example, FIG. 3 schematically shows that a shape of the second display region 101b is a rectangle, a shape of the center region 101b1 in the second display region 101b is a circle, and the edge region 101b2 is a region in the rectangle except for the circular center region. The center region 101b1 and the edge region 101b2 in the second display region 101b are in other shapes, which are determined according to actual product requirements. This is not limited in the embodiments of the present disclosure.

Optionally, the center region 101b1 acts as an under-screen camera region, and is provided with the second light-emitting units 104. The second pixel circuit groups 105 driving the second light-emitting units 104 to emit light are disposed in the first display region 101a. Therefore, the center region 101b1 is made to have a high light transmittance to achieve a camera shooting function, and emits light by connecting with the pixel circuit groups in other regions (the first display region 101a), without affecting the display function of a screen.

In some embodiments of the present disclosure, referring to FIG. 1, the second light-emitting units 104 in the second display region 101b are controlled, in a left-right split fashion, by the second pixel circuit groups 105 in the two first display regions 101a that are axisymmetric with respect to a center line extending in a first direction X. For example, the second light-emitting units 104 disposed on a left side of the center line are controlled by the second pixel circuit groups 105 in the first display region 101a disposed on the left side of the center line, and the second light-emitting units 104 disposed on a right side of the center line are controlled by the second pixel circuit groups 105 in the first display region 101a disposed on the right side of the center line. The first direction X is the pixel column direction of the display panel 10.

Referring to FIG. 4, orthographic projections of the first connection traces 107 on the base substrate 101 are not overlapped with orthographic projections of the second connection traces 108 on the base substrate 101. In this way, the possibility of overlap capacitances between the first connection traces 107 and the second connection traces 108 is reduced, thereby avoiding signal crosstalk.

Exemplarily, the orthographic projections of the first connection traces 107 on the base substrate 101 and the orthographic projections of the second connection traces 108 on the base substrate 101 are alternately distributed in the first direction X. In this way, distance between the first connection traces 107 disposed in the same layer in the first direction X is large, and distance between the second connection traces 108 disposed in the same layer in the first direction X is large, such that the connection traces in the same layer are prevented from affecting each other to guarantee the reliability of signal transmission. The orthographic projections of the first connection traces 107 on the base substrate 101 and the orthographic projections of the second connection traces 108 on the base substrate 101 are distributed in other forms, which are not limited in the embodiments of the present disclosure.

Figure 5:
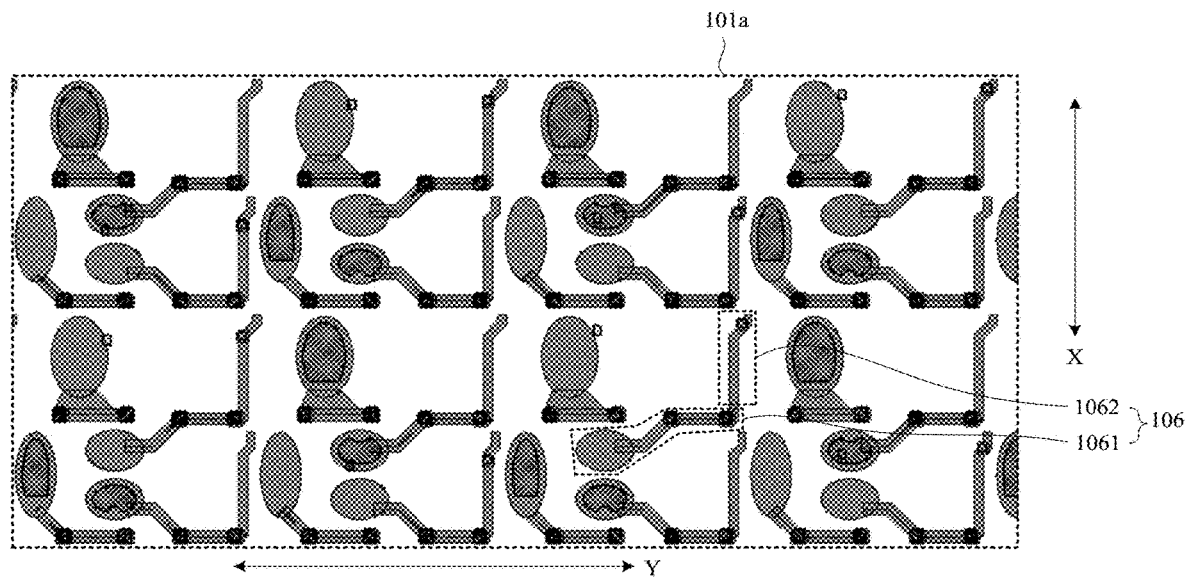
FIG. 5 is a schematic diagram of a dummy electrode pattern according to some embodiments of the present disclosure.

FIG. 5 is a schematic diagram of a dummy electrode pattern according to some embodiments of the present disclosure. Referring to FIG. 5, at least one of the dummy electrode patterns 106 includes a main body portion 1061 and a first connection portion 1062, and the first connection portion 1062 extends in the first direction X. In combination with FIG. 4 and FIG. 5, since the extension direction (the first direction X) of the first connection portion 1062 are intersected with an extension direction (the second direction Y) of the connection traces (the first connection traces 107 and the second connection traces 108), the first connection portion 1062 has an intersection with at least one of the first and second connection traces 107 and 108.

The first connection portion 1062 is connected, at the intersection of the first connection portion 1062 and at least one of the first and second connection traces 107 and 108, to the at least one of the first and second connection traces 107 and 108 by a via. In this way, the at least one connection trace is electrically connected to the dummy electrode pattern 106. Moreover, the dummy electrode pattern 106 is electrically connected to the second pixel circuit group 105, and thus, the at least one connection trace is electrically connected to the second pixel circuit group 105 by the dummy electrode pattern 106.

Figure 6:
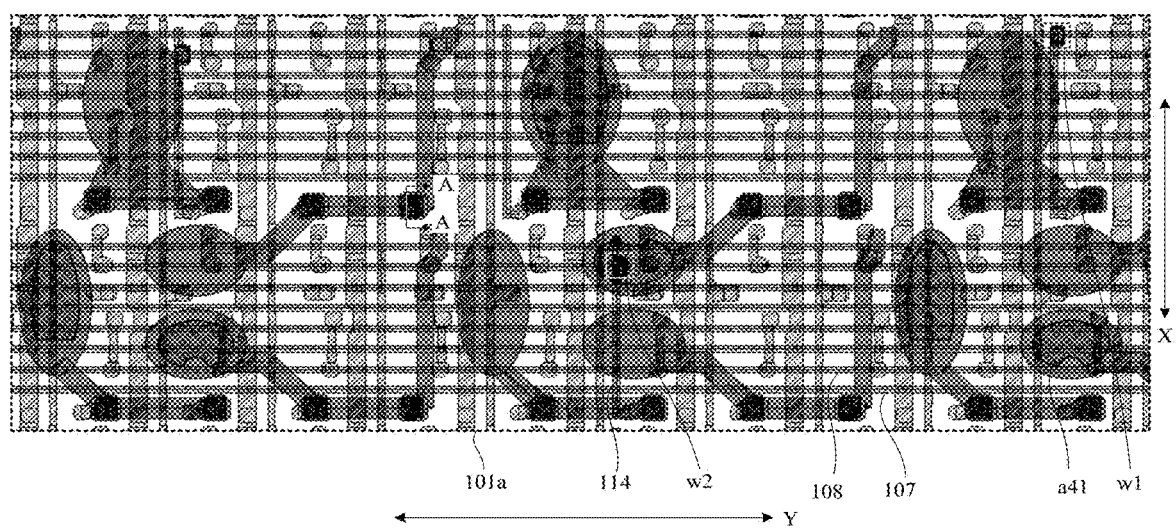
FIG. 6 is a partial schematic diagram of yet another display panel according to some embodiments of the present disclosure.
Figure 7:
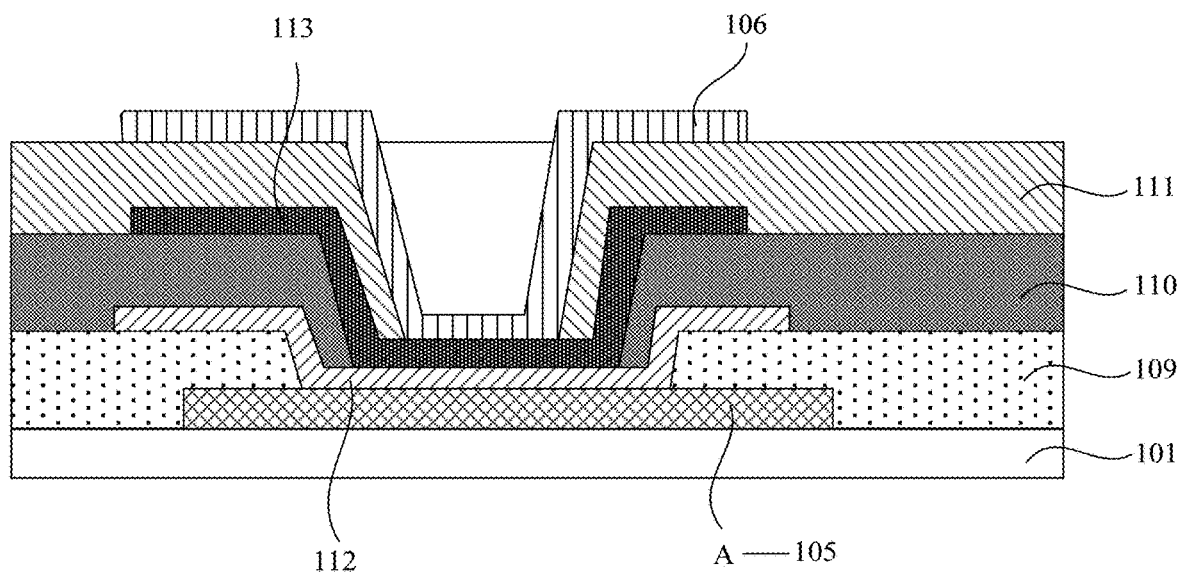
FIG. 7 is a sectional view taken in an AA direction shown in FIG. 6.

FIG. 6 is a partial schematic diagram of yet another display panel according to some embodiments of the present disclosure. FIG. 7 is a sectional view taken in an AA direction shown in FIG. 6. Referring to FIG. 6 and FIG. 7, each of the second pixel circuit groups 105 includes: a source-drain metal layer disposed on the base substrate 101. The source-drain metal layer includes a source and a drain spaced apart (only one drain A of one transistor in the second pixel circuit group 105 is shown in FIG. 7). The display panel 10 further includes: a first insulation layer 109, a second insulation layer 110 and a third insulation layer 111.

Optionally, a first connection pattern 112 shown in FIG. 7 is disposed in the same layer as the first connection traces 107, and a second connection pattern 113 shown in FIG. 7 is disposed in the same layer as the second connection traces 108. In this way, the source-drain metal layer, the first insulation layer 109, the first connection traces 107, the second insulation layer 110, the second connection traces 108, the third insulation layer 111, and the dummy electrode patterns 106 are sequentially stacked in a direction going away from the base substrate 101. That is, the first insulation layer 109 is disposed on a side of the source-drain metal layer distal from the base substrate 101; the first connection traces 107 are disposed on a side of the first insulation layer 109 distal from the base substrate 101; the second insulation layer 110 is disposed on a side of the first connection traces 107 distal from the base substrate 101; the second connection traces 108 are disposed on a side of the second insulation layer 110 distal from the base substrate 101; the third insulation layer 11 is disposed on a side of the connection traces 108 distal from the base substrate 101; and the dummy electrode patterns 106 are disposed on a side of the third insulation layer 111 distal from the second connection traces 108.

In the embodiments of the present disclosure, the dummy electrode patterns 106 at least include: a first dummy electrode pattern and a second dummy electrode pattern. The first dummy electrode pattern and the second dummy electrode pattern are two different dummy electrode patterns.

Figure 8:
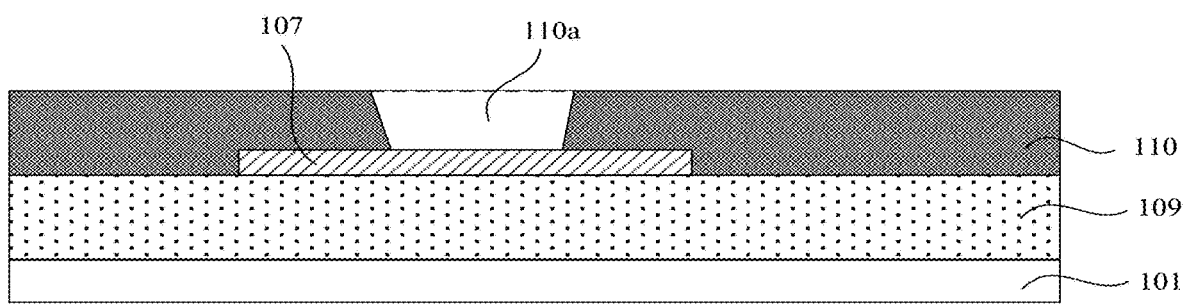
FIG. 8 is a partial schematic diagram of a first connection trace and a second insulation layer according to some embodiments of the present disclosure.
Figure 9:
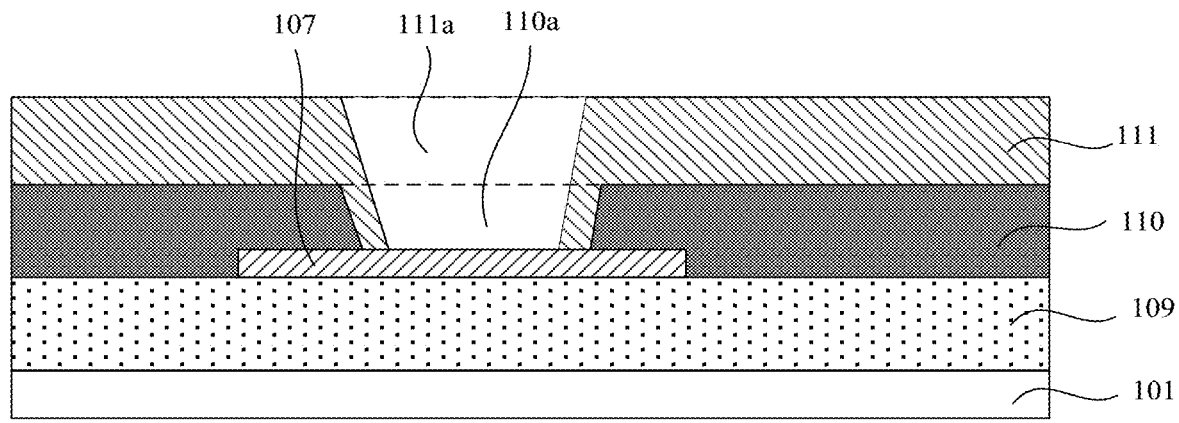
FIG. 9 is a partial schematic diagram of a third insulation layer according to some embodiments of the present disclosure.

FIG. 8 is a partial schematic diagram of a first connection trace and a second insulation layer according to some embodiments of the present disclosure. Referring to FIG. 8, the second insulation layer 110 is provided with a plurality of first vias (one first via 110a is shown in FIG. 8). Moreover, the first via 110a is configured to expose one of the first connection traces 107 disposed on a side of the second insulation layer 110 close to the base substrate 101. FIG. 9 is a partial schematic diagram of a third insulation layer according to some embodiments of the present disclosure. Referring to FIG. 9, the third insulation layer 111 is provided with a plurality of third vias 111a (one third via 111a is shown in FIG. 9). The third vias 111a are in one-to-one correspondence with the first vias 110a.

An orthographic projection of each of the first vias 110a on the base substrate 101 is at least partially overlapped with an orthographic projection of the corresponding third via 111a on the base substrate 101. For example, in combination with FIG. 8 and FIG. 9, the orthographic projection of the third via 111a on the base substrate 101 is within the orthographic projection of the corresponding first via 110a on the base substrate 101.

Figure 10:
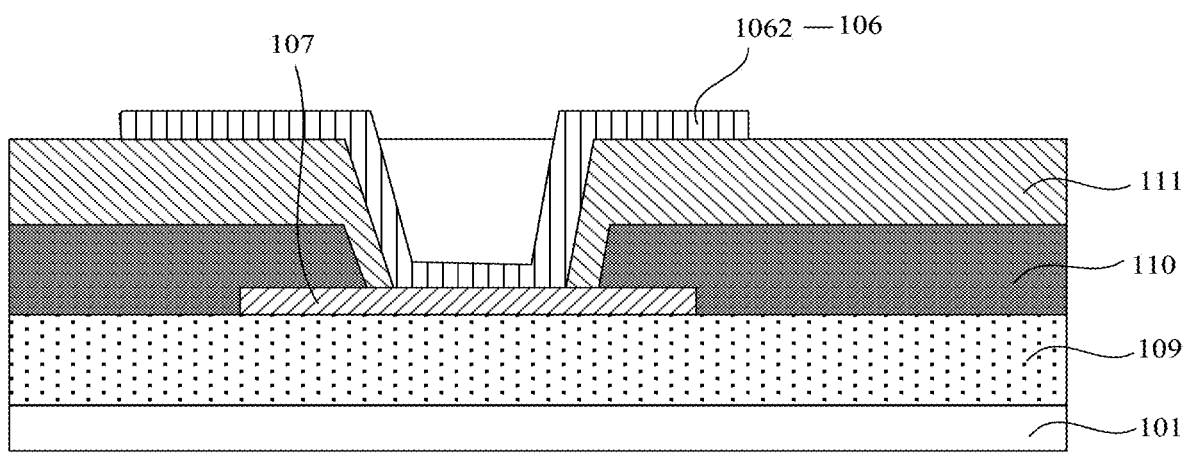
FIG. 10 is a schematic diagram of a first connection trace and a dummy electrode pattern according to some embodiments of the present disclosure.

FIG. 10 is a schematic diagram of a first connection trace and a dummy electrode pattern according to some embodiments of the present disclosure. In combination with FIG. 8 to FIG. 9, at least part of the first connection portion 1062 of the first dummy electrode pattern among the dummy electrode patterns 106 is disposed within the third via 111a and the first via 110a, and electrically connected to the first connection trace 107 by the third via 111a and the first via 110a.

Figure 11:
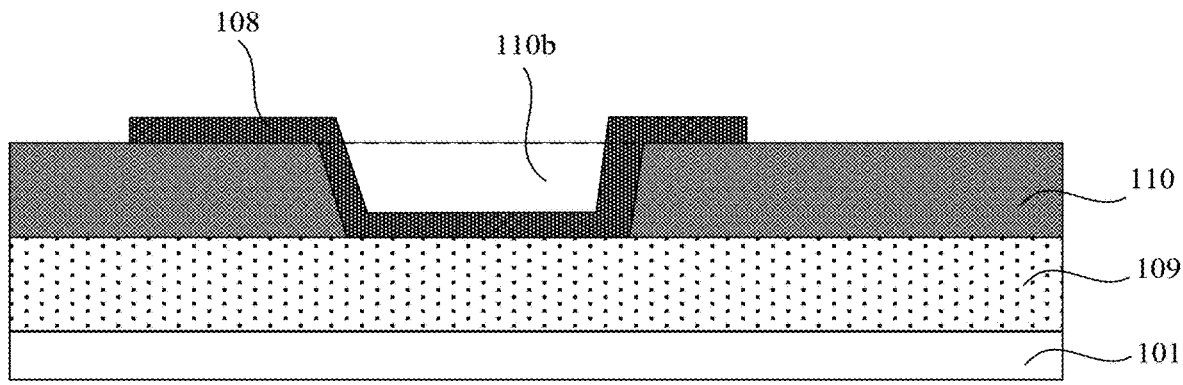
FIG. 11 is a schematic diagram of a second connection trace and a second insulation layer according to some embodiments of the present disclosure.
Figure 12:
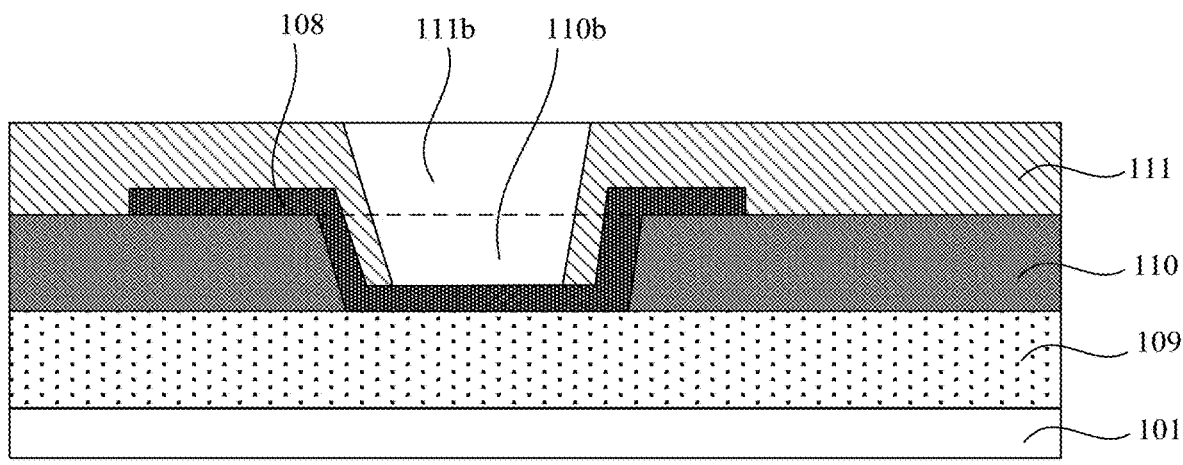
FIG. 12 is a partial schematic diagram of a third insulation layer according to some embodiments of the present disclosure.

FIG. 11 is a schematic diagram of a second connection trace and a second insulation layer according to some embodiments of the present disclosure. Referring to FIG. 11, the second insulation layer 110 is provided with a plurality of second vias 110b (one second via 110b is shown in FIG. 11). Moreover, each of the second connection traces 108 is at least partially disposed within the second via 110b. FIG. 12 is a partial schematic diagram of a third insulation layer according to some embodiments of the present disclosure. Referring to FIG. 12, the third insulation layer 111 is provided with a plurality of fourth vias 111b (one fourth via 111b is shown in FIG. 12), wherein the fourth vias are in one-to-one correspondence with the second vias 110b. The fourth via 111b is configured to expose one of the second connection traces 108.

Figure 13:
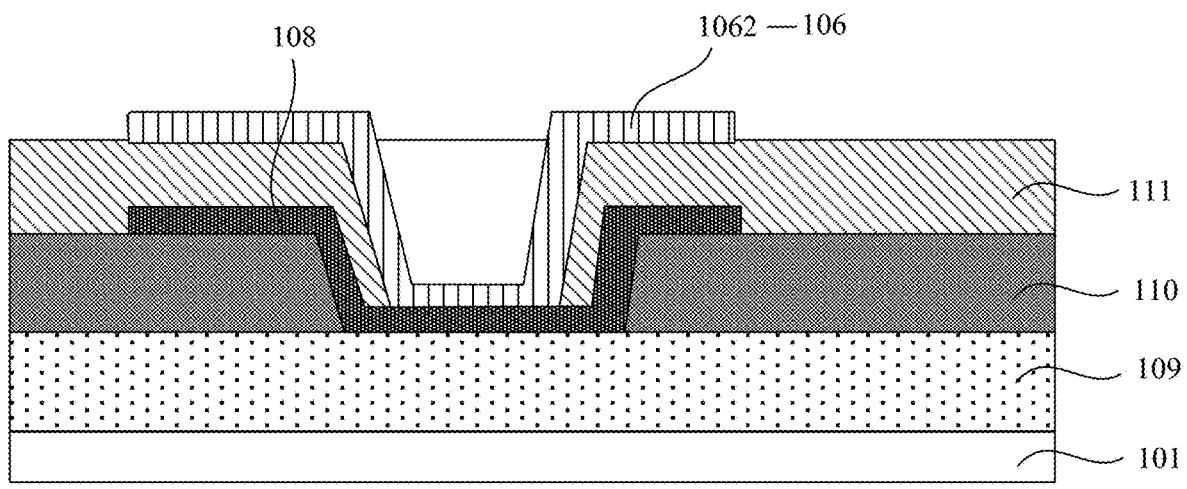
FIG. 13 is a schematic diagram of a second connection trace and a dummy electrode pattern according to some embodiments of the present disclosure.

FIG. 13 is a schematic diagram of a second connection trace and a dummy electrode pattern according to some embodiments of the present disclosure. In combination with FIG. 11 to FIG. 13, the first connection portion 1062 of the second dummy electrode pattern among the dummy electrode patterns 106 is at least partially disposed within the fourth via 111b, and electrically connected to the second connection trace 108 by the fourth via 111b.

In the embodiments of the present disclosure, since the second connection traces 108 are disposed on the side of the second insulation layer 110 distal from the base substrate 101, whether the second insulation layer 110 is provided with the second vias 110b or not will not affect the connection between the second connection traces 108 and the first connection portions 1062 of the second dummy electrode pattern. However, the second insulation layer 110 and the third insulation layer 111 are prepared with the same mask to save the production cost of the display panel 10. In this way, the second insulation layer 110 is provided with the second vias 110b at positions corresponding to positions where the fourth vias 111b are disposed in the third insulation layer 111.

That is, in combination with FIG. 11 to FIG. 13, an orthographic projection of each of the second vias 110b on the base substrate 101 is at least partially overlapped with an orthographic projection of the corresponding fourth via 111b on the base substrate 101. For example, the orthographic projection of each of the fourth vias 111b on the base substrate 101 is within the orthographic projection of the corresponding second via 110b on the base substrate 101. In this way, the second dummy electrode pattern is electrically connected to portions, disposed within the second vias 110b, of the second connection traces 108.

Without considering the production cost, the second connection traces 108 are directly formed on the side of the second insulation layer 110 distal from the base substrate 101 and no second via 110b is disposed in the second insulation layer 110.

According to the above description, the first connection portions 1062 of some (such as the first dummy electrode pattern) of the dummy electrode patterns 106 are electrically connected to the first connection traces 107 by the vias, and the first connection portions 1062 of other dummy electrode patterns (such as the second dummy electrode pattern) are electrically connected to the second connection traces 108 by the vias.

Since the first connection portion 1062 of the first dummy electrode pattern is electrically connected to the first connection trace 107 by the via, the first connection portion 1062 of the first dummy electrode pattern has an intersection with the first connection trace 107; and an orthographic projection of the intersection on the base substrate is overlapped with an orthographic projection of the first connection portion 1062 of the first dummy electrode pattern on the base substrate. Moreover, since the first connection portion 1062 of the second dummy electrode pattern is electrically connected to the second connection trace 108 by the via, the first connection portion 1062 of the second dummy electrode pattern has an intersection with the second connection trace 108; and an orthographic projection of the intersection on the base substrate is overlapped with an orthographic projection of the first connection portion 1062 of the second dummy electrode pattern on the base substrate.

That is, the orthographic projections of the intersections on the base substrate 101 are overlapped with the orthographic projections of the first connection portions 1062 on the base substrate 101.

Referring to FIG. 6, the display substrate 10 further includes: a plurality of second connection portions 114. The second connection portions 114 extend in the first direction X. Since the extension direction (the first direction X) of the second connection portions 114 is intersected with the extension direction (the second direction Y) of the connection traces (the first connection traces 107 and the second connection traces 108), the second connection portions 114 have an intersection with at least one of the first and second connection traces 107 and 108. In this way, the second connection portions 114 are electrically connected, at an intersection of at least one of the first and second connection traces 107 and 108, to the at least one of the first and second connection traces 107 and 108 by a via, such that the at least one connection trace is electrically connected to the second connection portion 114.

In some embodiments of the present disclosure, the second connection portions 114 are disposed in the same layer as the source-drain metal layers of the second pixel circuit groups 105. That is, the second connection portions 114 and the source-drain metal layers of the second pixel circuit groups 105 are prepared based on the same material and by using a same patterning process.

When the second connection portions 114 and the source-drain metal layers are prepared, each of the second connection portions 114 and a drain of one transistor are prepared as an integrated structure, such that the connection between the second pixel circuit groups 105 and at least one of the first and second connection traces 107 and 108 is achieved. In this way, at least one connection trace is electrically connected to the second pixel circuit group 105 by the second connection portion 114.

In the embodiments of the present disclosure, the second connection portions 114 and the dummy electrode patterns 106 are disposed in different layers. The second connection portions 114 are electrically connected to one dummy electrode pattern 106 by the via. That is, a signal transmitted in the dummy electrode pattern 106 is the same as a signal transmitted in the second connection portion 114.

Figure 14:
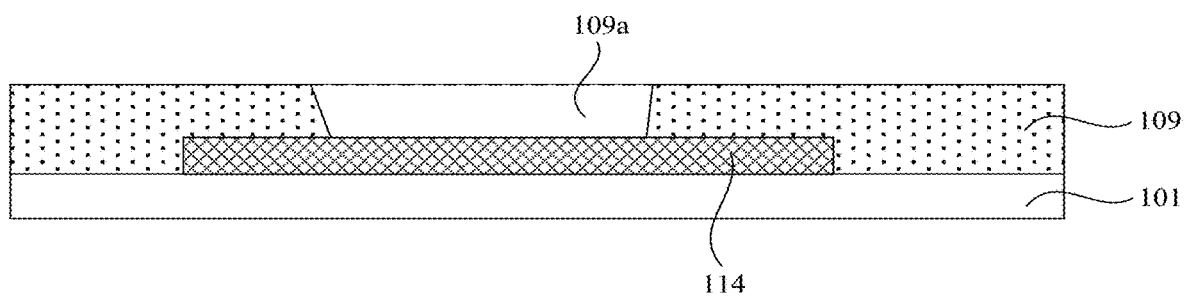
FIG. 14 is a schematic diagram of a second connection portion and a first insulation layer according to some embodiments of the present disclosure.
Figure 15:
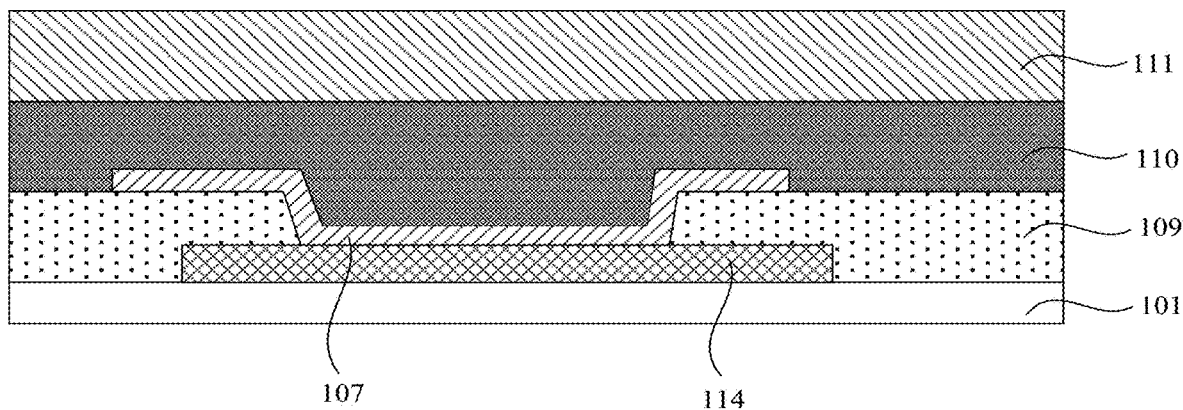
FIG. 15 is a schematic diagram of a second connection portion and a first connection trace according to some embodiments of the present disclosure.

FIG. 14 is a schematic diagram of a second connection portion and a first insulation layer according to some embodiments of the present disclosure. Referring to FIG. 14, the first insulation layer 109 is provided with a plurality of fifth vias 109a tone fifth via 109a is shown in FIG. 14). Moreover, the fifth via 109a is configured to expose one of the second connection portions 114 disposed on a side of the first insulation layer 109 close to the base substrate 101. FIG. 15 is a schematic diagram of a second connection portion and a first connection trace according to some embodiments of the present disclosure. Referring to FIG. 15, the first connection trace 107 is at least partially disposed within the fifth via 109a, and electrically connected to the second connection portion 114 by the fifth via 109a.

Figure 16:
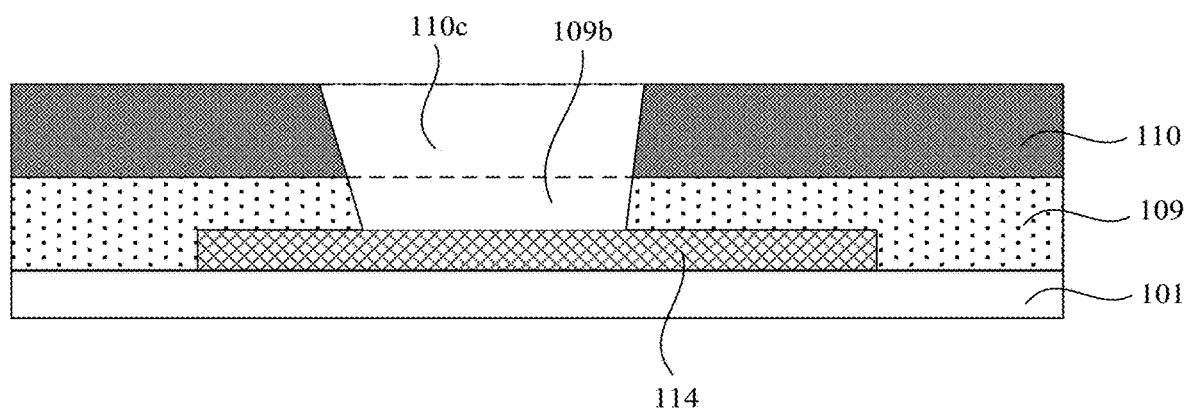
FIG. 16 is a schematic diagram of a second connection portion, a first insulation layer and a second insulation layer according to some embodiments of the present disclosure.

FIG. 16 is a schematic diagram of a second connection portion, a first insulation layer and a second insulation layer according to some embodiments of the present disclosure. Referring to FIG. 16, the first insulation layer 109 is provided with a plurality of sixth vias 109b, and the second insulation layer 110 is provided with a plurality of sixth vias 110c. The sixth vias 109b in the first insulation layer 109 are in one-to-one correspondence with the sixth vias 110c in the second insulation layer 110. Moreover, each of the sixth vias 109b in the first insulation layer 109 is at least partially overlapped with the corresponding the sixth via 110c in the second insulation layer 110.

Figure 17:
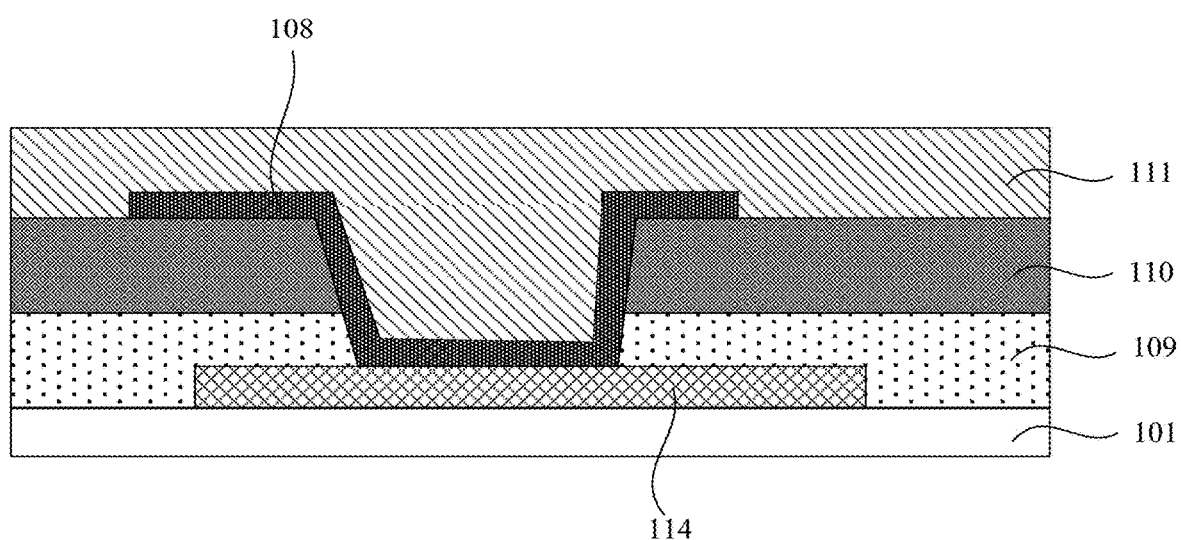
FIG. 17 is a schematic diagram of a second connection trace and a second connection portion according to some embodiments of the present disclosure.

For convenience of description, the sixth vias 109b in the first insulation layer 109 and the corresponding sixth vias 110c in the second insulation layer 110 are collectively referred to as the sixth vias. The sixth via (109b and 110c) is configured to expose one of the second connection portions 114. FIG. 17 is a schematic diagram of a second connection trace and a second connection portion according to some embodiments of the present disclosure. In combination with FIG. 16 and FIG. 17, the second connection portion 114 is at least partially disposed within the sixth via, and electrically connected to the second connection trace 108 by the sixth via.

The second connection portion 114 has an intersection with the connection trace (the first connection trace 107 or the second connection trace 108); and an orthographic projection of the intersection (for example, an intersection w1 shown in FIG. 6) on the base substrate 101 is not overlapped with the orthographic projection of any one of the dummy electrode patterns 106 on the base substrate 101. Alternatively, the orthographic projection of the intersection (for example, an intersection w2 shown in FIG. 6) on the base substrate 101 is within the orthographic projection of one of the dummy electrode patterns 106 on the base substrate 101.

Figure 18:
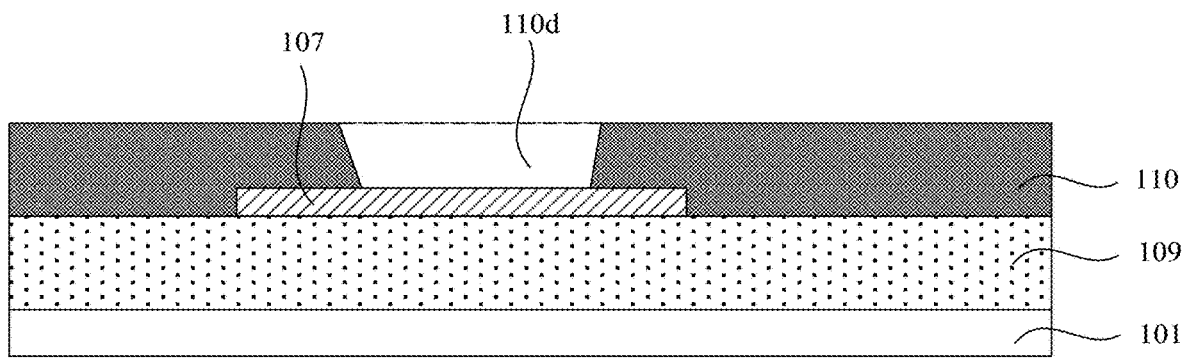
FIG. 18 is a partial schematic diagram of a first connection trace and a second insulation layer according to some embodiments of the present disclosure.
Figure 19:
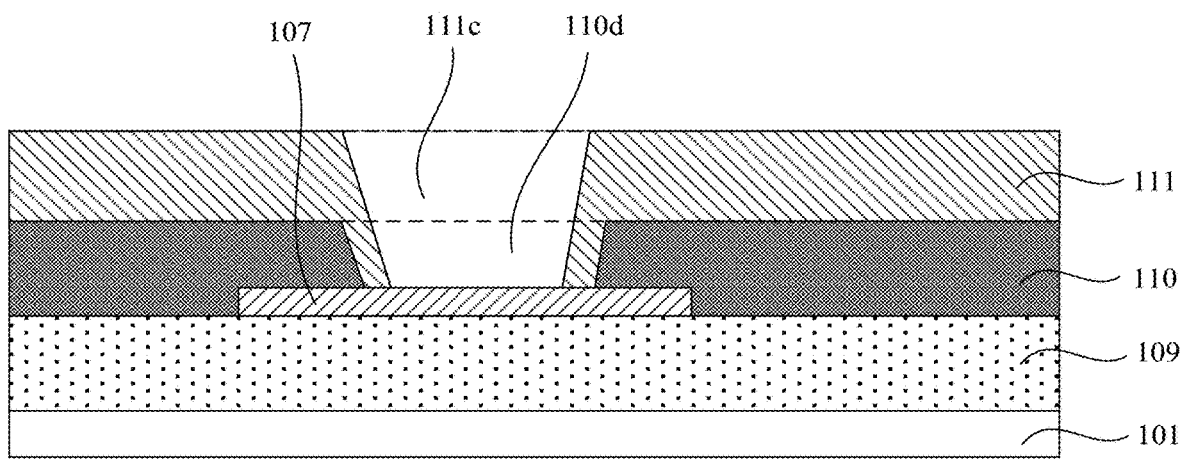
FIG. 19 is a partial schematic diagram of a third insulation layer according to some embodiments of the present disclosure.

FIG. 18 is a partial schematic diagram of a first connection trace and a second insulation layer according to some embodiments of the present disclosure. Referring to FIG. 18, the second insulation layer 110 is provided with a plurality of seventh vias 110d (one seventh via 110d is shown in FIG. 18). Moreover, the seventh via 110d is configured to expose one of the first connection traces 107 disposed on a side of the second insulation layer 110 close to the base substrate 101. FIG. 19 is a partial schematic diagram of a third insulation layer according to some embodiments of the present disclosure. Referring to FIG. 19, the third insulation layer 111 is provided with a plurality of ninth vias 111c (one ninth via 111c is shown in FIG. 19), wherein the ninth vias 111c are in one-to-one correspondence with the seventh vias 110d.

An orthographic projection of each of the seventh vias 110d on the base substrate 101 is at least partially overlapped with an orthographic projection of the corresponding ninth via 111c on the base substrate 101. For example, in combination with FIG. 18 and FIG. 19, the orthographic projection of the ninth via 111c on the base substrate 101 is within the orthographic projection of the corresponding seventh via 110d on the base substrate 101.

Figure 20:
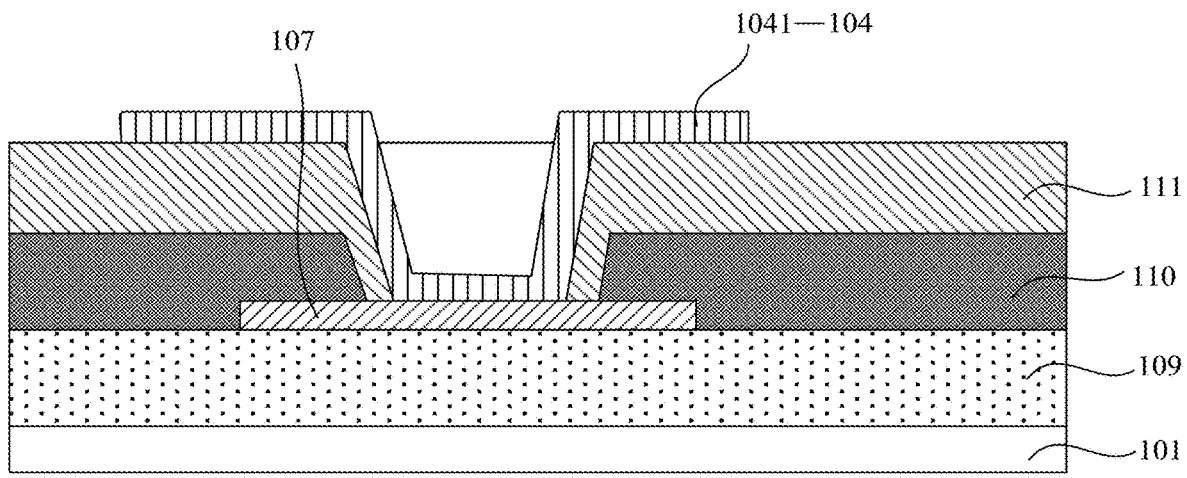
FIG. 20 is a schematic diagram of a first connection trace and a first electrode of a second light-emitting unit according to some embodiments of the present disclosure.

FIG. 20 is a schematic diagram of a first connection trace and a first electrode of a second light-emitting unit according to some embodiments of the present disclosure. In combination with FIG. 18 to FIG. 20, a first electrode 1041 of at least one of the second light-emitting units 104 is at least partially disposed within the seventh via 110d and the ninth via 111c, and electrically connected to the first connection trace 107 by the seventh via 110d and the ninth via 111c.

Figure 21:
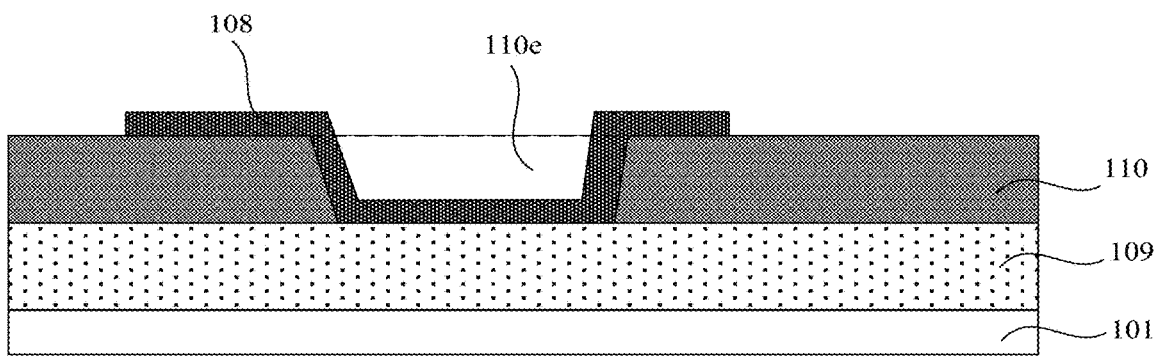
FIG. 21 is a schematic diagram of a second connection trace and a second insulation layer according to some embodiments of the present disclosure.
Figure 22:
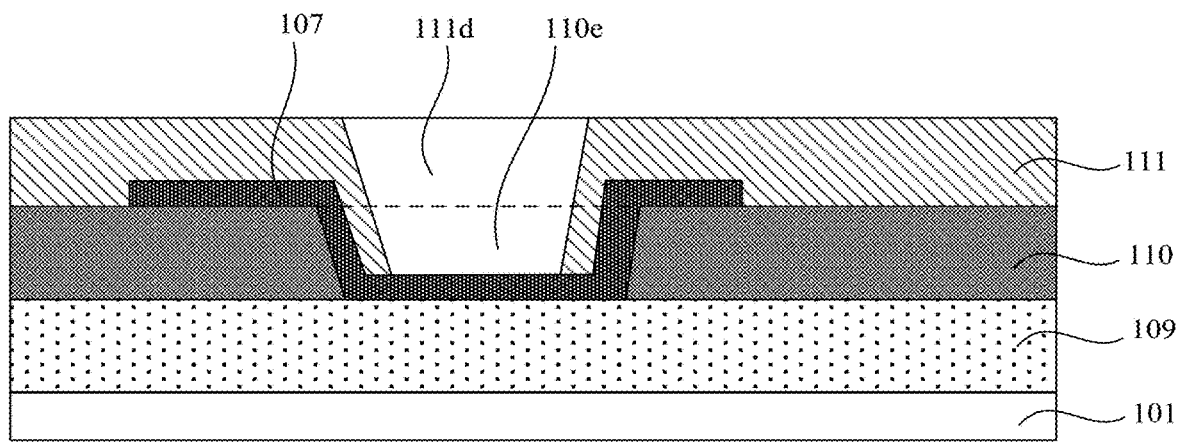
FIG. 22 is a schematic diagram of another third insulation layer according to some embodiments of the present disclosure.

FIG. 21 is a schematic diagram of a second connection trace and a second insulation layer according to some embodiments of the present disclosure. Referring to FIG. 21, the second insulation layer 110 is provided with a plurality of eighth vias 110e (one eighth via 110e is shown in FIG. 21). Moreover, each of the second connection traces 108 is at least partially disposed within the eighth via 110e. FIG. 22 is a schematic diagram of another third insulation layer according to some embodiments of the present disclosure. Referring to FIG. 22, the third insulation layer 111 is provided with a plurality of tenth vias 111d (one tenth via 111d is shown in FIG. 22), wherein the tenth vias 111d are in one-to-one correspondence with the eighth vias 110e. The tenth via 111d is configured to expose one of the second connection traces 108.

Figure 23:
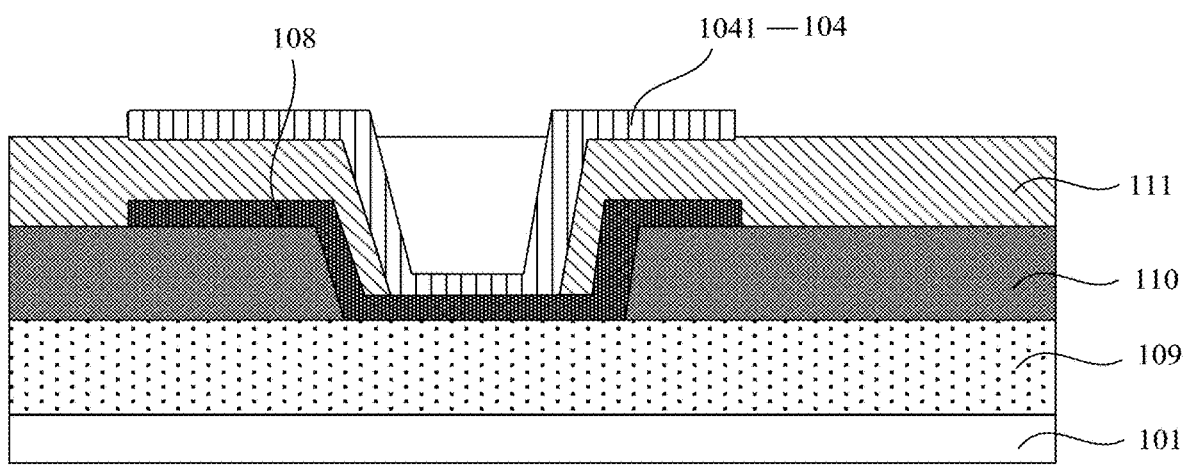
FIG. 23 is a schematic diagram of a second connection trace and a first electrode of a second light-emitting unit according to some embodiments of the present disclosure.

FIG. 23 is a schematic diagram of a second connection trace and a first electrode of a second light-emitting unit according to some embodiments of the present disclosure. In combination with FIG. 21 to FIG. 23, the first electrode 1041 of at least one of the second light-emitting units 104 is at least partially disposed within the tenth via 111d, and electrically connected to the second connection trace 108 by the tenth via 111d.

In the embodiments of the present disclosure, since the second connection traces 108 are disposed on the side of the second insulation layer 110 distal from the base substrate 101, whether the second insulation layer 110 is provided with the eighth vias 110e or not will not affect the connection between the second connection traces 108 and the first electrodes of the second light-emitting units 104. However, the second insulation layer 110 and the third insulation layer 111 are prepared with the same mask to save the production cost of the display panel 10. In this way, the second insulation layer 110 is provided with the eighth vias 110e at positions corresponding to positions where the tenth vias 111d are disposed in the third insulation layer 111.

That is, in combination with FIG. 21 to FIG. 23, an orthographic projection of each of the eighth vias 110e on the base substrate 101 is at least partially overlapped with an orthographic projection of the corresponding tenth via 111d on the base substrate 101. For example, the orthographic projection of each of the eighth vias 110e on the base substrate 101 is within the orthographic projection of the corresponding tenth via 111d on the base substrate 101. In this way, the first electrodes 1041 of the second light-emitting units 104 are electrically connected to portions, disposed within the eighth vias 110e, of the second connection traces 108.

According to the above description, the first electrodes 1041 of some of the second light-emitting units 104 are electrically connected to the first connection traces 107 by the vias, and the first electrodes 1041 of other second light-emitting units 104 are electrically connected to the second connection trace 108 by the vias.

Referring to FIG. 7, the display panel 10 further includes: a plurality of first connection patterns 112 and a plurality of second connection patterns 113, wherein the second connection patterns 113 are in one-to-one correspondence with the first connection patterns 112. One first connection pattern 112 and one second connection pattern 113 are shown in FIG. 7.

Figure 24:
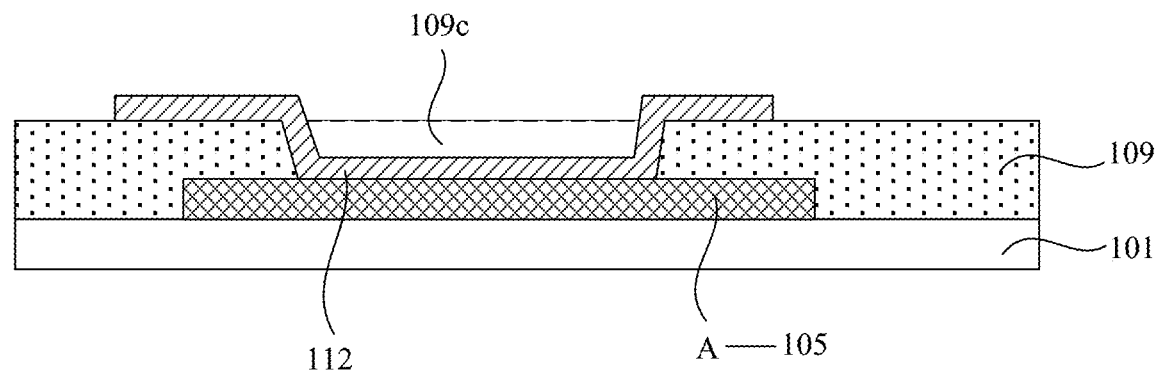
FIG. 24 is a schematic diagram of a first insulation layer and a first connection pattern according to some embodiments of the present disclosure.
Figure 25:
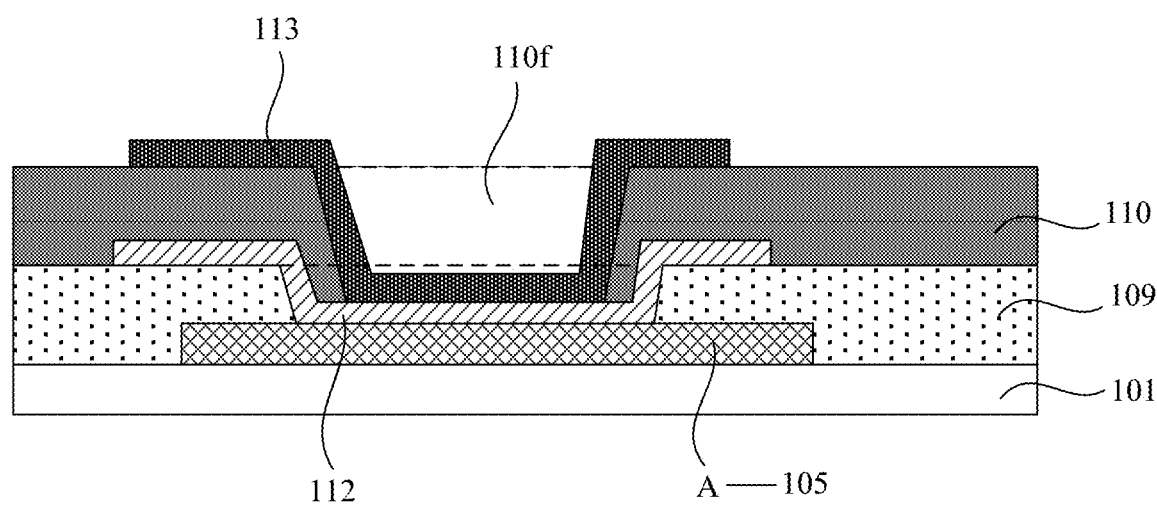
FIG. 25 is a schematic diagram of a second insulation layer and a second connection pattern according to some embodiments of the present disclosure.
Figure 26:
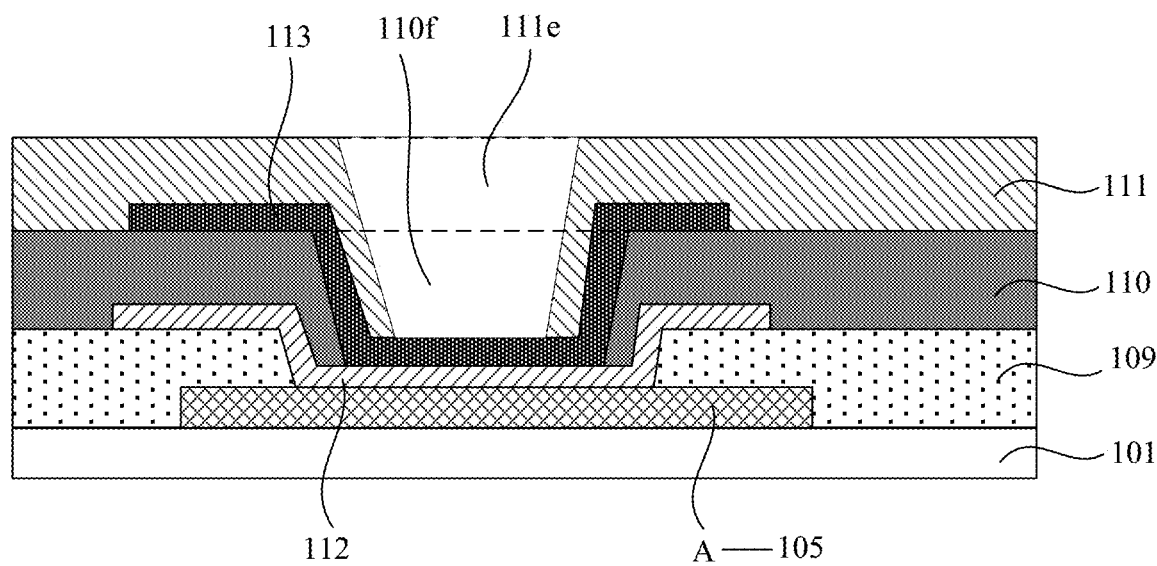
FIG. 26 is a schematic diagram of yet another third insulation layer according to some embodiments of the present disclosure.

FIG. 24 is a schematic diagram of a first insulation layer and a first connection pattern according to some embodiments of the present disclosure. FIG. 25 is a schematic diagram of a second insulation layer and a second connection pattern according to some embodiments of the present disclosure. FIG. 26 is a schematic diagram of yet another third insulation layer according to some embodiments of the present disclosure. Referring to FIG. 24 to FIG. 26, the first insulation layer 109 is provided with a plurality of eleventh vias 109c; the second insulation layer 110 is provided with a plurality of twelfth vias 110f, the twelfth vias 110f being in one-to-one correspondence with the eleventh vias 109c; and the third insulation layer 111 is provided with a plurality of thirteenth vias 111e, the thirteenth vias 111e being in one-to-one correspondence with the twelfth vias 110f. An orthographic projection of each of the eleventh vias 109c on the base substrate 101 is at least partially overlapped with an orthographic projection of the corresponding twelfth via 110f on the base substrate 101. An orthographic projection of each of the twelfth vias 110f on the base substrate 101 is at least partially overlapped with an orthographic projection of the corresponding thirteenth via 11 on the base substrate 101.

In combination with FIG. 7 and FIG. 24 to FIG. 26, each of the eleventh vias 109c is configured to expose a drain of one transistor in one of the second pixel circuit groups 105; and one of the first connection patterns 112 is at least partially disposed within the eleventh via 109c, and electrically connected to the drain A by the eleventh via 109c. Each of the twelfth vias 110f is configured to expose one of the first connection patterns 112; and one second connection pattern 113 corresponding to the first connection pattern 112 is at least partially disposed within the twelfth via 110f, and electrically connected to the first connection pattern 112 by the twelfth via 110f. Each of the thirteenth vias 111e is configured to expose one of the second connection patterns 113; and one of the dummy electrode patterns 106 is at least partially disposed within the thirteenth via 111e, and connected to the second connection pattern 113 by the thirteenth via 111e. That is, the dummy electrode pattern 106 is connected to the drain A of the second pixel circuit group 105 by the second connection pattern 113 and the first connection pattern 112.

Optionally, the orthographic projections of the twelfth vias 110f on the base substrate 101 are within the orthographic projections of the eleventh vias 109c on the base substrate 101, and the orthographic projections of the thirteenth vias 111e on the base substrate 101 are within the orthographic projections of the twelfth vias 110f on the base substrate 101.

Figure 27:
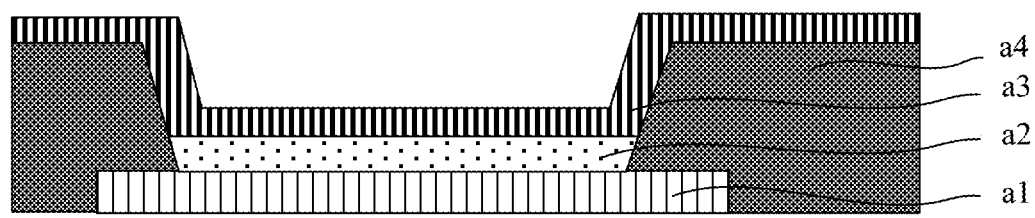
FIG. 27 is a schematic diagram of a structure of a first light-emitting unit according to some embodiments of the present disclosure.

In some embodiments of the present disclosure, each of the first pixel circuit groups 103 further includes: a source-drain metal layer disposed on the base substrate 101. The source-drain metal layer includes a source and a drain spaced apart. FIG. 27 is a schematic diagram of a structure of a first light-emitting unit according to some embodiments of the present disclosure. Referring to FIG. 27, the first light-emitting unit 102 includes a first electrode a1, a light-emitting layer a2 and a second electrode a3, which are sequentially stacked in a direction going away from the base substrate 101. The first electrode a1 is an anode, and the second electrode a3 is a cathode. The drain of each of the first pixel circuit groups 103 is electrically connected to the first electrode a1 of the first light-emitting unit 102.

Optionally, the dummy electrode patterns 106 is disposed in the same layer as the first electrode a1 in the first light-emitting unit 102. That is, the dummy electrode patterns 106 are dummy anode patterns. In this case, a schematic connection between the drain of one transistor in the first pixel circuit groups 103 and the first electrode at of the first light-emitting unit 102 may be referred to FIG. 7. For example, after the second pixel circuit group 105 shown in FIG. 7 is replaced with the first pixel circuit group 103, and the dummy electrode pattern 106 shown in FIG. 7 is replaced with the first electrode a1 of the first light-emitting unit 102, FIG. 7 is used to indicate a connection relationship between the drain of one transistor in the first pixel circuit group 103 and the first electrode a1 of the first light-emitting unit 102.

Referring to FIG. 27, the first light-emitting unit 102 further includes: a pixel define layer a4 disposed between the first electrode a1 and the light-emitting layer a2. Referring to FIG. 2, FIG. 4 and FIG. 6, the pixel define layer a4 is provided with a plurality of openings a41, each of the openings a41 being configured to expose the first electrode a1 of one of the first light-emitting units 102. Moreover, orthographic projections of the openings a41 on the base substrate 101 are not overlapped with the orthographic projection of any one of the dummy electrode patterns 106 on the base substrate 101.

In some embodiments, the first electrodes a1 of the first light-emitting units 102 are exposed by the openings a4l in the pixel define layer a4, such that the first electrodes a1 of the first light-emitting units 102 are in contact with the light-emitting layer a2 to implement light emission. Since the orthographic projections of the openings a41 on the base substrate 101 are not overlapped with the orthographic projection of any one of the dummy electrode patterns 106 on the base substrate 101, no light is emitted at the dummy electrode patterns 106.

It should be noted that, for the convenience of illustration, both the light-emitting layer and the cathode layer are not shown in the top view provided in the embodiments of the present disclosure, and the first electrodes a1 of the first light-emitting units 102 and the dummy electrode patterns 106 are distinguished only by the openings a41 in the pixel define layer a4. For example, in FIG. 2, the pattern having the opening a41 in the pixel define layer a4 is the first electrode a1, and the pattern having no opening a41 in the pixel define layer a4 is the dummy electrode pattern 106.

In the embodiments of the present disclosure, the first light-emitting units 102 include: a plurality of first light-emitting units of a first color, a plurality of first light-emitting units of a second color, and a plurality of first light-emitting units of a third color. At least one of the first light-emitting units of the first color, at least one of the first light-emitting units of the second color and at least one of the first light-emitting units of the third color among the first light-emitting units 102 constitute a light-emitting unit group b. The first color, the second color and the third color are three primary colors. For example, the first color is red (R), the second color is green (G), and the third color is blue (B).

Moreover, the dummy electrode patterns 106 constitute at least one dummy electrode pattern group c. The number of the dummy electrode patterns 106 in each dummy electrode pattern group c is equal to the number of the first light-emitting units 102 in one light-emitting unit group b.

Figure 28:
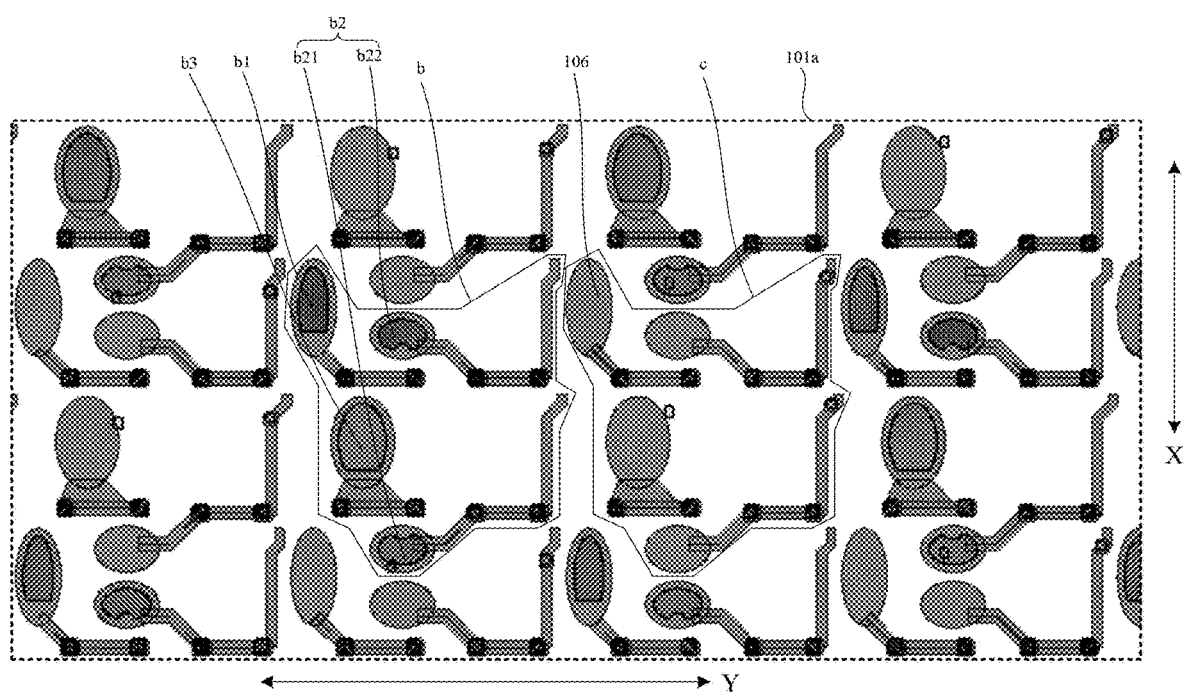
FIG. 28 is a schematic diagram of a first light-emitting unit and a dummy electrode pattern according to some embodiments of the present disclosure.

Exemplarily, referring to FIG. 28, each light-emitting unit group b includes: one first light-emitting unit b1 of the first color, two first light-emitting units (b21 and b22) of the second color, and one first light-emitting unit b3 of the third color. The two first light-emitting units (b21 and b22) of the second color are collectively referred to as a first light-emitting unit pair b2 of the second color. That is, each light-emitting unit group b includes four first light-emitting units 102, and each dummy electrode pattern group c includes four dummy electrode patterns 106.

In some embodiments of the present disclosure, the dummy electrode patterns 106 in each dummy electrode pattern group c are in one-to-one correspondence with the first light-emitting units 102 in one light-emitting unit group b, and each of dummy electrode patterns 106 and the first electrode a1 in the corresponding first light-emitting unit 102 are of the same shape and area.

Since the dummy electrode patterns 106 and the first electrodes a1 in the corresponding first light-emitting units 102 are of the same shape and area, overlap area between the first electrodes at in the first display region 101a and the connection traces is the same as overlap area between the dummy electrode patterns 106 and the connection traces, such that the overlap capacitance between the first electrodes a1 in the first display region 101a and the connection traces is consistent with the overlap capacitance between the dummy electrode patterns 106 and the connection traces, thereby guaranteeing the display effect of the display panel 10. The first connection traces 107 and the second connection traces 108 are collectively referred to as connection traces.

Figure 29:
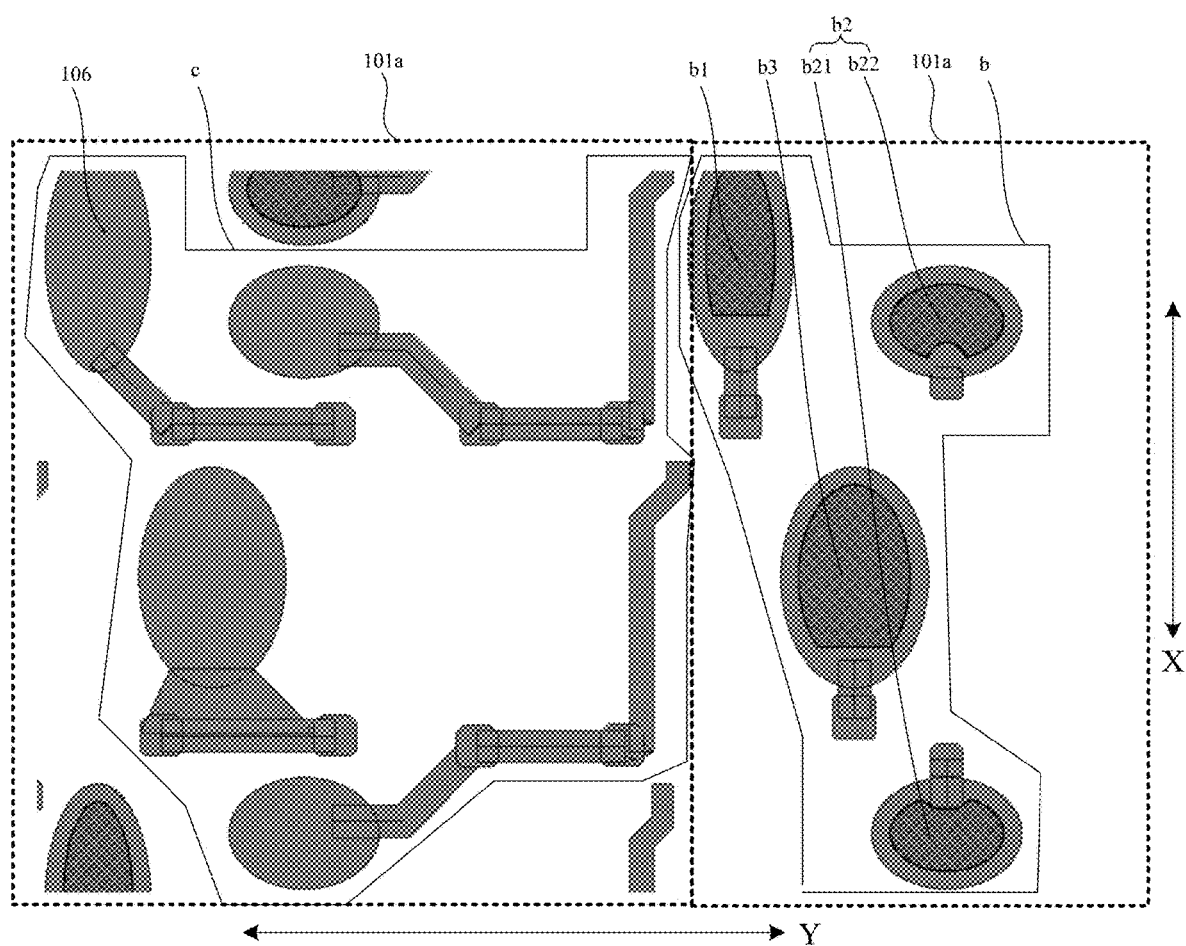
FIG. 29 is a schematic diagram of a second light-emitting unit and a dummy electrode pattern according to some embodiments of the present disclosure.

In some embodiments of the present disclosure, referring to FIG. 29, the second light-emitting units 104 further include: a plurality of second light-emitting units of the first color, a plurality of second light-emitting units of the second color, and a plurality of second light-emitting units of the third color. At least one of the second light-emitting units of the first color, at least one of the second light-emitting units of the second color and at least one of the second light-emitting units of the third color among the second light-emitting units 104 also constitute a light-emitting unit group b.

In some embodiments, the number of the dummy electrode patterns 106 in each dummy electrode pattern group c is equal to the number of the second light-emitting units 104 in one light-emitting unit group b. Exemplarily, each light-emitting unit group b includes: one second light-emitting unit b1 of the first color, two second light-emitting units (b21 and b22) of the second color, and one second light-emitting unit b3 of the third color. The two second light-emitting units (b21 and b22) of the second color are collectively referred to as a second light-emitting unit pair b2 of the second color.

In the embodiments of the present disclosure, referring to FIG. 3, the base substrate 101 includes two first display regions 101a. The two first display regions 101a are disposed on either side of the second display region 101b. The base substrate 101 further includes: a first peripheral region 101d and a second peripheral region 101e. The first peripheral region 101d and the second peripheral region 101e are disposed on either side of the two first display regions 101a. That is, the first peripheral region 101d, one of the first display regions 101a, the second display region 101b, the other first display region 101a, and the second peripheral region 101e are disposed in the second direction Y. For example, the first peripheral region 101d is disposed on a left side of an axis of the base substrate 101 in the first direction X, and the second peripheral region 101e is disposed on a right side of the axis of the base substrate 101 in the first direction X.

Figure 30:
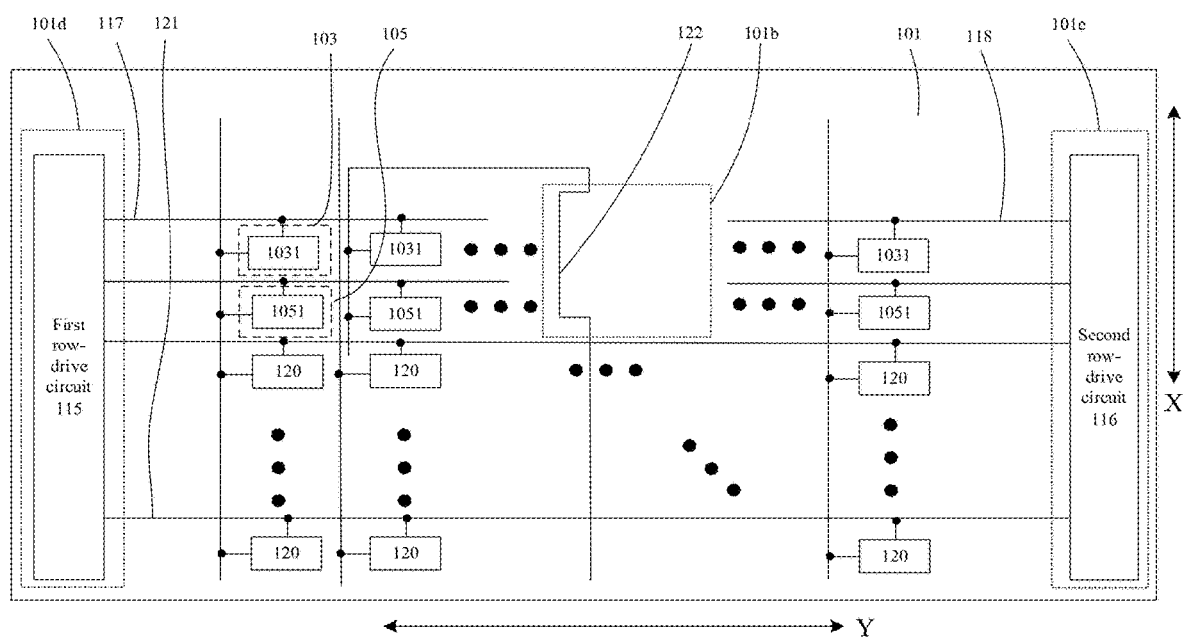
FIG. 30 is a schematic diagram of a structure of another display panel according to some embodiments of the present disclosure.

FIG. 30 is a schematic diagram of a structure of another display panel according to some embodiments of the present disclosure. Referring to FIG. 30, the display panel 10 further includes: a first row-drive circuit 115 disposed in the first peripheral region 101d and a second row-drive circuit 116 disposed in the second peripheral region 101e. The first row-drive circuit 115 is electrically connected to the first and second pixel circuit groups 103 and 105 in one of the first display regions 101a. The second row-drive circuit 116 is electrically connected to the first and second pixel circuit groups 103 and 105 in the other first display region 101a. The first display region 101a, where the first and second pixel circuit groups 103 and 105 electrically connected to the first row-drive circuit 115 are disposed, is disposed on the left side of the axis of the base substrate 101 in the first direction X. The other first display region 101a, where the first and second pixel circuit groups 103 and 105 electrically connected to the second row-drive circuit 116 are disposed, is disposed on the right side of the axis of the base substrate 101 in the first direction X.

For ease of understanding, the first display region 101a disposed on the left side of the axis of the base substrate 101 in the first direction X is referred to as the first display region 101a on the left, and the other first display region 101a disposed on the right side of the axis of the base substrate 101 in the first direction X is referred to as the first display region 101a on the right. Referring to FIG. 30, the first row-drive circuit 115 is electrically connected to each of the pixel circuit groups in the first display region 101a on the left to provide a row-drive signal to each of the pixel circuit groups in the first display region 101a on the left. Moreover, the first row-drive circuit 115 is not electrically connected to any one of the pixel circuit groups in the first display region 101a on the right. The second row-drive circuit 116 is electrically connected to each of the pixel circuit groups in the first display region 101a on the right to provide a row-drive signal to each of the pixel circuit groups in the first display region 101a on the right. Moreover, the second row-drive circuit 116 is not electrically connected to any one of the pixel circuit groups in the first display region 101a on the left.

That is, in the embodiments of the present disclosure, the pixel circuit groups in the first display region 101a on the left and the pixel circuit groups in the first display region 101a on the right are driven by different row-drive circuits, and row-drive signals provided to the pixel circuit groups in the two first display regions 101a do not affect each other.

In some embodiments, referring to FIG. 30, the display panel 10 further includes: a plurality of first scanning signal lines 117 disposed in one of the first display regions 101a, and a plurality of second scanning signal lines 118 disposed in the other first display region 101a. The first scanning signal lines 117 and the second scanning signal lines 118 all extend along the second direction V.

In some embodiments, the first row-drive circuit 115 is electrically connected to the first scanning signal lines 117, and electrically connected to the first and second pixel circuit groups 103 and 105 in one of the first display regions 101a by the first scanning signal lines 117. The second row-drive circuit 116 is electrically connected to the second scanning signal lines 118, and electrically connected to the first and second pixel circuit groups 103 and 105 in the other first display region 101a by the second scanning signal lines 118.

The first scanning signal lines 117 and the second scanning signal lines 118 are disposed in the same layer, and orthographic projections of the first scanning signal lines 117 on the base substrate 101 and orthographic projections of the second scanning signal lines 118 on the base substrate 101 are both outside the second display region 101b. That is, both the first scanning signal lines 117 and the second scanning signal lines 118 are not disposed in the second display region 101b, such that the transmittance of the second display region 101b is guaranteed.

In some embodiments of the present disclosure, the number of the first scanning signal lines 117 in the display panel 10 is the same as the number of rows of pixel circuits in the first and second pixel circuit groups 103 and 105 in one of the first display regions 101a (the first display region 101a on the left). The number of the second scanning signal lines 118 in the display panel 10 is the same as the number of rows of pixel circuits in the first and second pixel circuit groups 103 and 105 in the other first display region 101a (the first display region 10a on the right).

In some embodiments, referring to FIG. 3, the base substrate 101 further includes: a third display region 101c and a third peripheral region 101f. The third display region 101c is disposed on the same side of the first and second display regions 101a and 101b, and the third peripheral region 101f is disposed on the same side of the first and second display regions 101a and 101b. Moreover, the first peripheral region 101d and the second peripheral region 101e are disposed on either side of the third display region 101c in the second direction Y.

Referring to FIG. 3, the base substrate 101 includes two first display regions 101a. The first display regions 101a and the second display region 101b are both of a rectangular shape. The first display regions 101a and the second display region 101b are both disposed on the edge of the display region. The first display regions 101a, the second display region 101b and the third display region 101c are collectively referred to as a display region. The edges of the first and second display regions 101a and 101b distal from the third display region 101c are in contact with the third peripheral region 101f. One edge, extending in the second direction Y, of the second display region 101b is in contact with the third display region 101c, and the other edge is in contact with the third peripheral region 101f. Two edges, extending in the first direction X, of the second display region 101b are in contact with the two first display regions 101a, respectively.

In some embodiments, referring to FIG. 1, the display panel 10 further includes: a plurality of third light-emitting units 119 and a plurality of third pixel circuit groups 120. The third light-emitting units 119 and the third pixel circuit groups 120 are disposed in the third display region 101c, and the third pixel circuit groups 120 are connected to the third light-emitting units 119 in one-to-one correspondence. The first row-drive circuit 115 disposed in the first peripheral region 101d and the second row-drive circuit 116 disposed in the second peripheral region 101e are both connected to the third pixel circuit groups 120 in the third display region 101c. That is, the first row-drive circuit 115 and the second row-drive circuit 116 both provide row-drive signals to the third pixel circuit groups 120, and the third pixel circuit groups 120 in the third display region 101c are driven by two row-drive circuits.

Exemplarily, the display panel 10 includes a plurality of third scanning signal lines 121. Each of the third scanning signal lines 121 has one end connected to the first row-drive circuit 115 and has the other end connected to the second row-drive circuit 116, and the third scanning signal lines 121 are also connected to the third pixel circuit groups 120.

Optionally, a density of the third light-emitting units 119 is greater than a density of the first light-emitting units 102, and greater than a density of the second light-emitting units 104. The density (i.e., the pixel density) of the second light-emitting units 104 in the under-screen camera region (the center region 101b1 in the second display region 101b) is lower than the density of the third light-emitting units 119 in a normal display region (the third display region 101c), such that a camera may be disposed under a region having a low pixel density and allowing more light to transmit. The above description "the density of the third light-emitting units 119 is greater than the density of the first light-emitting units 102, and greater than the density of the second light-emitting units 104" refers to that, in the same area, the number of the third light-emitting units 119 is greater than the number of the second light-emitting units 104, and greater than the number of the first light-emitting units 102.

In the embodiments of the present disclosure, the third display region 101c is a main display region and has relatively more pixels per inch (PPI). That is, the third light-emitting units 119 with higher density are disposed in the third display region 101c for display. Each of the third light-emitting units 119 is in correspondence with one of the third pixel circuit groups 120, and is driven to emit light by the corresponding one of the third pixel circuit groups 120. The second display region 101b allows light incident from a display side of the display panel 10 to pass through the display panel 10 and reach the back side of the display panel 10, such that sensors and other components disposed on the back side of the display panel 10 work normally. The embodiments of the present disclosure are not limited thereto. For example, the second display region 101b allows light emitted from the back side of the display panel 10 to pass through the display panel 10 and reach the display side of the display panel 10. The first display regions 101a and the second display region 101b include a plurality of light-emitting units for display. However, in some embodiments, since the pixel circuit groups that drive the light-emitting units to emit light are usually opaque, the light-emitting units in the second display region 101b and the pixel circuit groups driving the same are detached from physical positions to improve the transmittance of the center region 101b1 in the second display region 101b. For example, the second pixel circuit groups 105 connected to the light-emitting units in the second display region 101b (for example, the second light-emitting units 104 in the second display region 101b in FIG. 1) are disposed in the first display regions 101a. That is, the second pixel circuit groups 105 will occupy part of the space of the first display regions 101a. Moreover, the remaining space of the first display regions 101a is configured for arrangement of the first light-emitting units 102 and the first pixel circuit groups 103 in the first display regions 101a. For example, each dot-filled box in the first display regions 101a in FIG. 1 represents a pixel circuit group. In some embodiments, in a case that the pixel circuit group represented by a filled box is the first pixel circuit group 103, the filled box also represent the first light-emitting unit 102. In this case, the first pixel circuit groups 103 (or the first light-emitting units 102) in the first display regions 11a and the second pixel circuit groups 105 connected to the second light-emitting units 104 in the second display region 101b are arranged in an array in the first display regions 101a. In this way, the pixel per inches of the first and second display regions 101a and 101b are lower than the pixel per inch of the third display region 101c. That is, the pixel density of the third display region 101c is greater than the pixel density of the first display region 101a, and greater than the pixel density of the second display region 101b.

In some embodiments of the present disclosure, referring to FIG. 1 and FIG. 30, the display panel 10 further includes: a plurality of data lines 122. In some embodiments, in a case that the shape of the second display region 101b is a rectangle, an orthographic projection of a portion, disposed in the second display region 101b, of each of the data lines 122 on the base substrate 101 is a straight line or a broken line, and is within a region in the second display region 101b close to the first display region 101a. That is, the portion, disposed in the second display region 101b, of each of the data lines 122 is designed along the edge of the second display region 101b.

Figure 31:
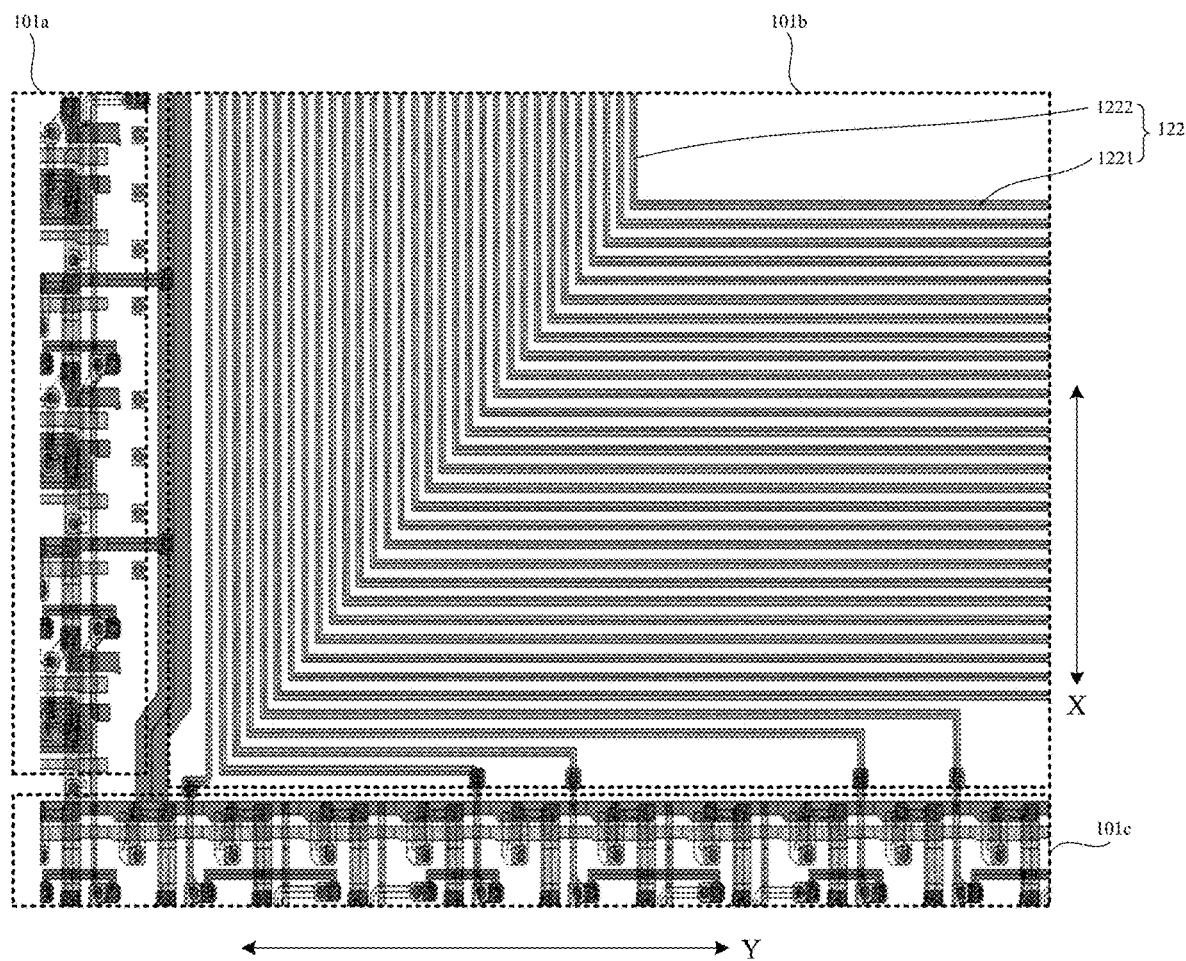
FIG. 31 is a partial schematic diagram of still another display panel according to some embodiments of the present disclosure.
Figure 32:
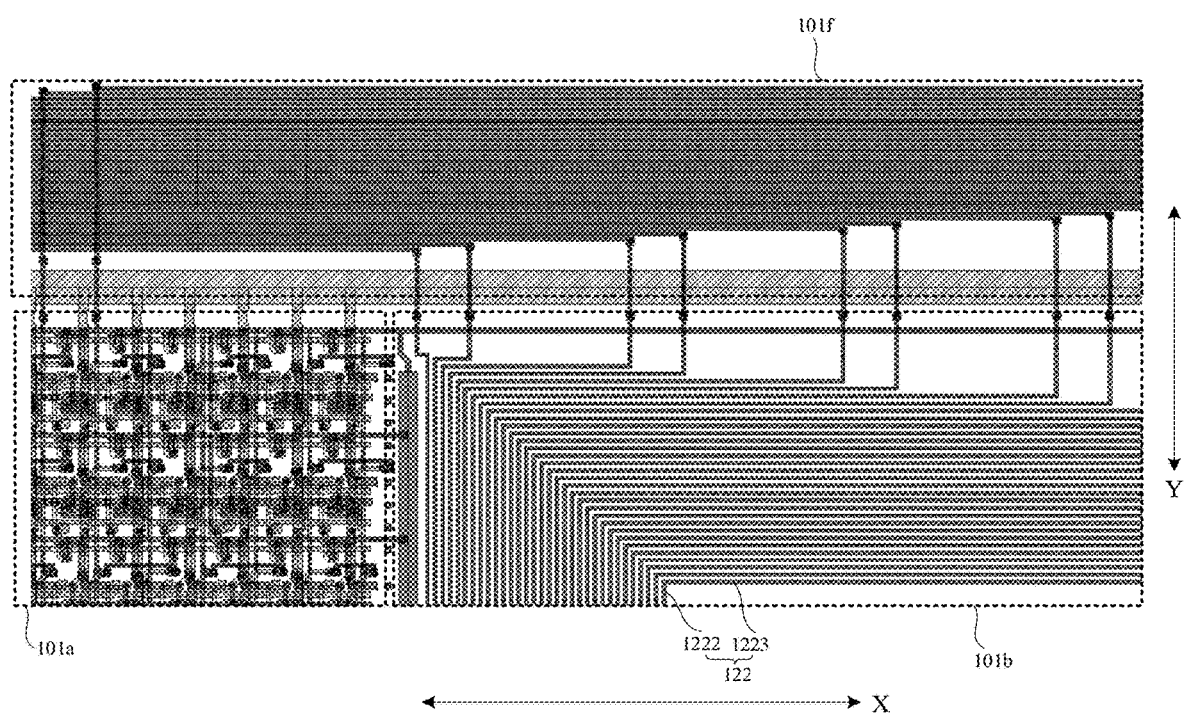
FIG. 32 is a partial schematic diagram of still another display panel according to some embodiments of the present disclosure.

Optionally, referring to FIG. 31 and FIG. 32, the orthographic projection of the portion, disposed in the second display region 101b, of each of the data lines 122 on the base substrate 101 includes a first line segment 1221, a second line segment 1222 and a third line segment 1223, which are sequentially connected. An extension direction of the first line segment 1221 and an extension direction of the third line segment 1223 are both the second direction Y, and an extension direction of the second line segment 1222 is the first direction X. Moreover, the first line segment 1221 is disposed on the side of the second display region 101b close to the third display region 101c, the second line segment 1222 is disposed on the side of the second display region 101b close to the first display region 101a, and the third line segment 1223 is disposed on the side of the second display region 101b close to the third peripheral region 101f.

In some embodiments, referring to FIG. 32, each of the data lines 122 is disposed in the third peripheral region 101f, and a portion, disposed in the third peripheral region 101f, of each of the data lines 122 is connected to the third line segment 1223 of the data line 122.

Figure 33:
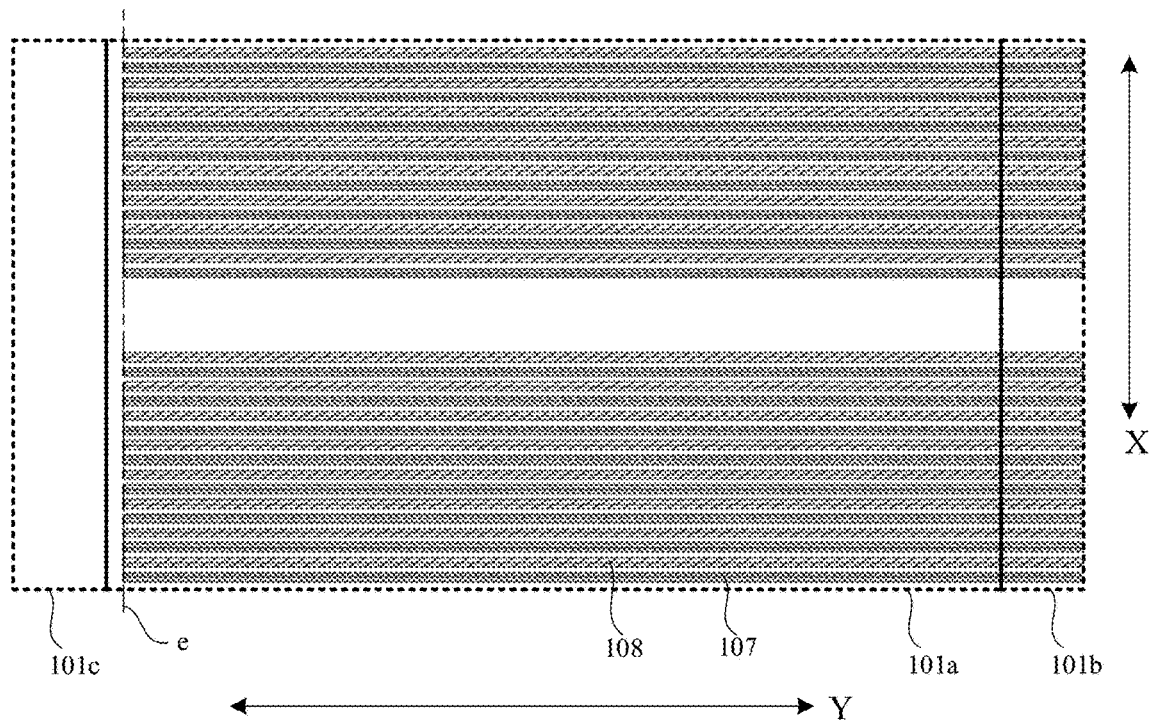
FIG. 33 is a partial schematic diagram of a first connection trace and a second connection trace according to some embodiments of the present disclosure.

FIG. 33 is a partial schematic diagram of a first connection trace and a second connection trace according to some embodiments of the present disclosure. Referring to FIG. 33, a connecting line of the other ends of the first connection traces 107 and a connecting line of the other ends of the second connection traces 108 are both parallel to an edge of the first display region 101a distal from the second display region 101b. A distance from the connecting line of the other ends of the first connection traces 107 to the edge of the first display region 101a distal from the second display region 101b, and a distance from the connecting line of the other ends of the second connection traces 108 to the edge of the first display region 101a distal from the second display region 101b, are both less than a distance threshold.

In some embodiments, the other end of each of the first connection traces 107 is one of the two ends of the first connection trace 107 distal from the second display region 101b. The other end of each of the second connection traces 108 is one of the two ends of the second connection trace 108 distal from the second display region 101b. Because the distance from the connecting line of the other ends of the first connection traces 107 to the edge of the first display region 101a distal from the second display region 101b is designed small, and the distance from the connecting line of the other ends of the second connection traces 108 to the edge of the first display region 101a distal from the second display region 101b is designed small, the connection traces are present all over the first display regions 101a. In this way, the overlap capacitances all over the first display regions 101a are made consistent, such that the uniformity of the display effect of the first display regions 101a is guaranteed. As shown in FIG. 33, the connecting line of the other ends of the first connection traces 107 and the connecting line of the other ends of the second connection traces 108 are represented by the same reference numeral e.

Optionally, the connecting line of the other ends of the first connection traces 107, the connecting line of the other ends of the second connection traces 108, and the edge of the first display region 101a distal from the second display region 101b are approximately parallel to the first direction X. The connecting line of the other ends of the first connection traces 107, the connecting line of the other ends of the second connection traces 108, and the edge of the first display region 101a distal from the second display region 101b are co-linear. That is, the other ends of the first connection traces 107 and the other ends of the second connection traces 108 all extend to the edge of the first display region 101a distal from the second display region 101b.

In the embodiments of the present disclosure, the term "substantially" means that an error range within 15% is allowable. For example, "substantially parallel" means that an angle between two lines ranges from 0 to 30 degrees, such as 0 to 10 degrees, 0 to 15 degrees, and the like.

In the embodiments of the present disclosure, the number of the first light-emitting units 102, capable of emitting light, in the first display regions 101a is relatively small, and the number of the third light-emitting units 119, capable of emitting light, in the third display region 101c is relatively large. As a result, display brightness of the first display region 101a is lower than display brightness of the third display region 101c. Therefore, each of the first light-emitting units 102 is driven by at least two pixel circuits to improve brightness of the first light-emitting unit 102, such that the display brightness of the first display regions 101a is improved, thereby guaranteeing that the display effects of the first display regions 101a are consistent with the display effect of the third display region 101c.

Optionally, referring to FIG. 30, each of the first pixel circuit groups 103 includes: a first pixel circuit 1031. The first pixel circuit 1031 in each of the first pixel circuit groups 103 is configured to be electrically connected to at least one of the first light-emitting units 102. Each of the second pixel circuit groups 105 includes: a second pixel circuit 1051. The second pixel circuit 1052 in each of the second pixel circuit groups 105 is configured to be electrically connected to at least one of the second light-emitting units 104.

In some embodiments, in a case that the first pixel circuit group 103 only includes the first pixel circuit 1031 and does not include other pixel circuits, wherein the first pixel circuit 1031 is configured to be electrically connected to one of the first light-emitting units 102, the first light-emitting unit 102 is driven by one pixel circuit. In a case that the second pixel circuit group 105 only includes the second pixel circuit 1051 and does not include other pixel circuits, wherein the second pixel circuit 1051 is configured to be electrically connected to one of the second light-emitting units 104, the second light-emitting unit 104 is driven by one pixel circuit.

In some embodiments, in a case that the first pixel circuit group 103 only includes the first pixel circuit 1031 and does not include other pixel circuits, wherein the first pixel circuit 1031 is configured to be electrically connected to the first light-emitting units 102 (for example, two first light-emitting units 102), the first light-emitting units 102 are driven by the same pixel circuit. In a case that the second pixel circuit group 105 only includes the second pixel circuit 1051 and does not include other pixel circuits, wherein the second pixel circuit 1051 is configured to be electrically connected to the second light-emitting units 104 (for example, two second light-emitting units 104), the second light-emitting units 104 are driven by the same pixel circuit.

Figure 34:
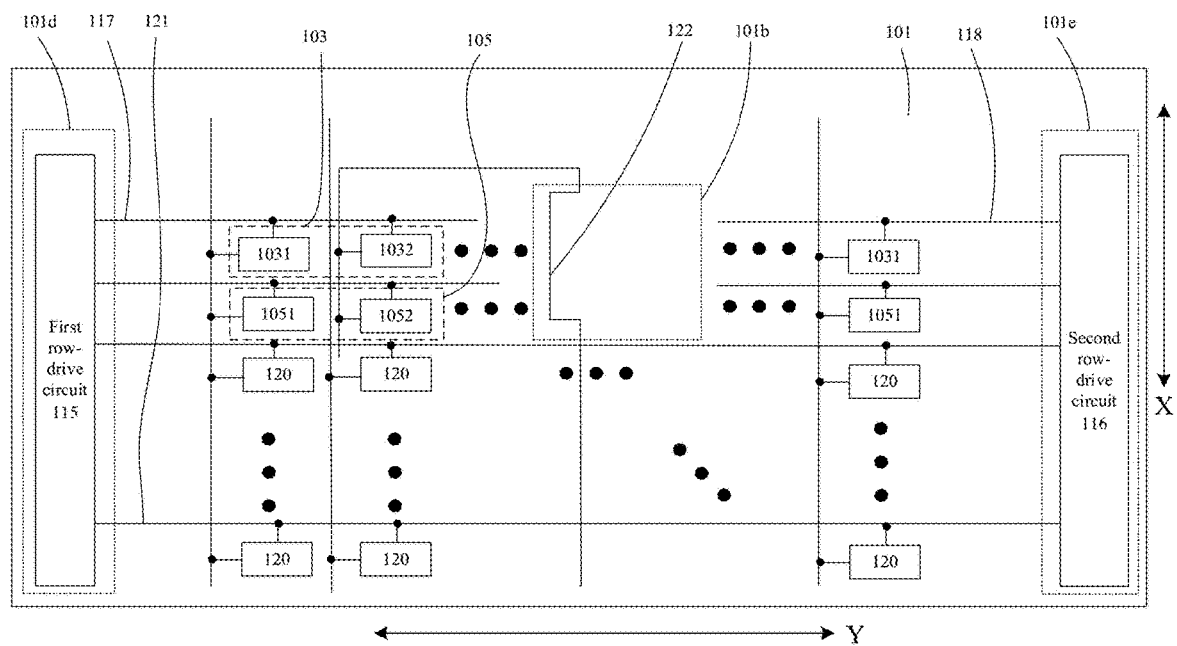
FIG. 34 is a schematic diagram of a structure of yet another display panel according to some embodiments of the present disclosure.

Optionally, referring to FIG. 34, each of the first pixel circuit groups 103 further includes: at least one third pixel circuit 1032. At least two pixel circuits in each of the first pixel circuit groups 103 are configured to be electrically connected to the same first light-emitting unit 103. Each of the second pixel circuit groups 105 further includes: at least one fourth pixel circuit 1052. At least two pixel circuits in each of the second pixel circuit groups 105 are configured to be electrically connected to the same second light-emitting unit 104.

In some embodiments, in a case that the first pixel circuit group 103 includes one first pixel circuit 1031 and one third pixel circuit 1032, wherein the first pixel circuit 1031 and the third pixel circuit 1032 are configured to be electrically connected to the same first light-emitting unit 102, the first light-emitting unit 102 is driven by two pixel circuits. In a case that the second pixel circuit group 105 includes one second pixel circuit 1051 and one fourth pixel circuit 1052, wherein the second pixel circuit 1051 and the fourth pixel circuit 1052 are configured to be electrically connected to one of the second light-emitting units 104, the second light-emitting unit 104 is driven by two pixel circuits.

In some embodiments, in a case that the first pixel circuit group 103 includes one first pixel circuit 1031 and a plurality of third pixel circuits 1032, wherein the first pixel circuit 1031 and the third pixel circuits 1032 are configured to be electrically connected to the same first light-emitting unit 102, the first light-emitting unit 102 is driven by a plurality of pixel circuits. In a case that the second pixel circuit group 105 includes one second pixel circuit 1051 and a plurality of fourth pixel circuits 1052, wherein the second pixel circuit 1051 and the fourth pixel circuits 1052 are configured to be electrically connected to the same second light-emitting unit 104, the second light-emitting unit 104 is driven by a plurality of pixel circuits.

In some embodiments of the present disclosure, the electrical connection between each pixel circuit and the corresponding light-emitting unit refers to: the pixel circuit being electrically connected to the first electrode of the light-emitting unit. For example, at least two pixel circuits in the first pixel circuit group 103 being configured to be electrically connected to the same first light-emitting unit 102 refers to: at least two pixel circuits in the first pixel circuit group 103 are configured to be electrically connected to the first electrode a1 of the same first light-emitting unit 102.

Optionally, the first pixel circuit group 103 including one first pixel circuit 1031 and one third pixel circuit 1032 and the second pixel circuit group 105 including one second pixel circuit 1051 and one fourth pixel circuit 1052 is taken as an example.

Figure 35:
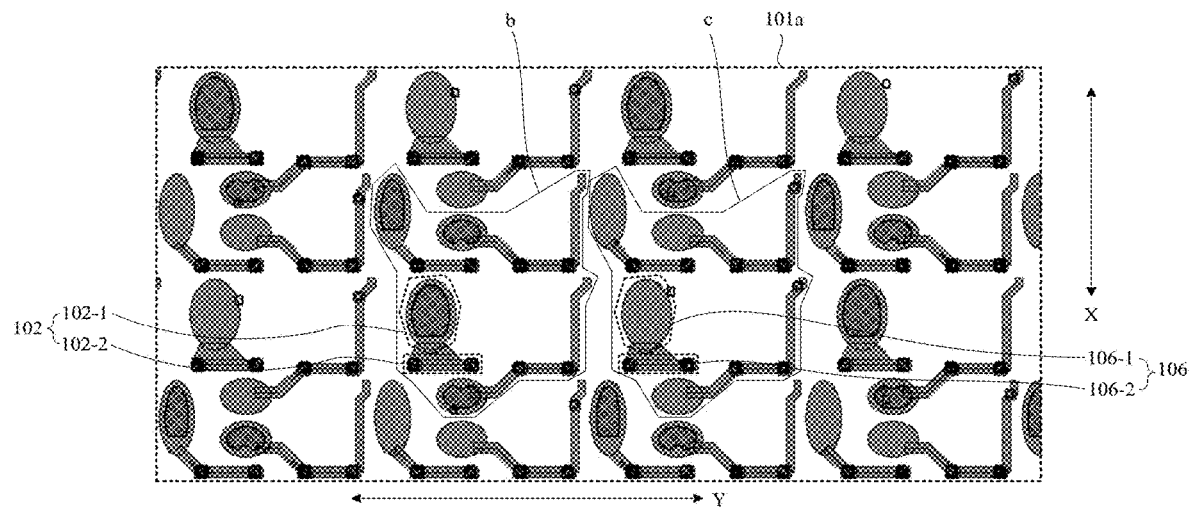
FIG. 35 is a schematic diagram of another first light-emitting unit and another dummy electrode pattern according to some embodiments of the present disclosure.

Referring to FIG. 35, the first electrode a1 of the first light-emitting unit 102 includes a first pattern 102-1 and a second pattern 102-2. The second pattern 102-2 is configured to be electrically connected to at least two pixel circuits in the first pixel circuit group 103. The second pattern 102-2 is a connection of the first electrode a1 of the first light-emitting unit 102 and the first pixel circuit group 103.

An orthographic projection of the connection (the second pattern 102-2) of the first electrode a1 of the first light-emitting unit 102 and the first pixel circuit group 103 on the base substrate 101 is not overlapped with the orthographic projections of the first connection traces 107 on the base substrate 101, and not overlapped with the orthographic projections of the second connection traces 108 on the base substrate 101. In this way, the connections of the first electrodes a1 and the first pixel circuit groups 103 are prevented from being affected by the first connection traces 107 and the second connection traces 108, such that the normal light emission of the first light-emitting units 102 connected to the first pixel circuit groups 103 are guaranteed.

In some embodiments of the present disclosure, the number of the second light-emitting units 104 disposed in the second display region 101b is generally small to ensure the transmittance of the second display region 101b, which consequently leads to lower display brightness of the second display region 101b as compared with the display brightness of the third display region 101c. Therefore, each of the second light-emitting units 104 is driven by at least two pixel circuits to improve the brightness of the second light-emitting unit 104, such that the display brightness of the second display region 101b is improved, thereby guaranteeing that the display effect of the second display region 101b is consistent with the display effect of the third display region 101c.

Referring to FIG. 35, each of the dummy electrode patterns 106 include a third pattern 106-1 and a fourth pattern 106-2. The fourth pattern 106-2 is configured to be electrically connected to at least two pixel circuits in the second pixel circuit group 105. The fourth pattern 106-2 is a connection of the dummy electrode pattern 106 and the first pixel circuit group 103.

An orthographic projection of the connection (the fourth pattern 106-2) of the dummy electrode pattern 106 and the second pixel circuit group 105 on the base substrate 101 is not overlapped with the orthographic projections of the first connection traces 107 on the base substrate 101, and not overlapped with the projections of the second connection traces 108 on the base substrate 101. In this way, the connections of the dummy electrode patterns 106 and the first pixel circuit groups 103 are prevented from being affected by the first connection traces 107 and the second connection traces 108, thereby guaranteeing that the second pixel circuit groups 105 drive, by the dummy electrode patterns 106, the second light-emitting units 104 to emit light normally.

In some embodiments of the present disclosure, the first pixel circuit group 103 and the second pixel circuit group 105 are the same in structure, for example, both the first pixel circuit group 103 and the second pixel circuit group 105 include two pixel circuits. In some embodiments, the first pixel circuit group 103 and the second pixel circuit group 105 are referred to as a pixel circuit pair f. For the convenience of subsequent description, the two pixel circuits in each of the first and second pixel circuit groups 103 and 105 are referred to as a first pixel circuit and a second pixel circuit. That is, for the convenience of description, the third pixel circuits 1032 in the first pixel circuit groups 103 are referred to as second pixel circuits, the second pixel circuits 1051 in the second pixel circuit groups 105 are referred to as first pixel circuits, and fourth pixel circuits 1052 in the second pixel circuit groups 105 are referred to as second pixel circuits.

Figure 36:
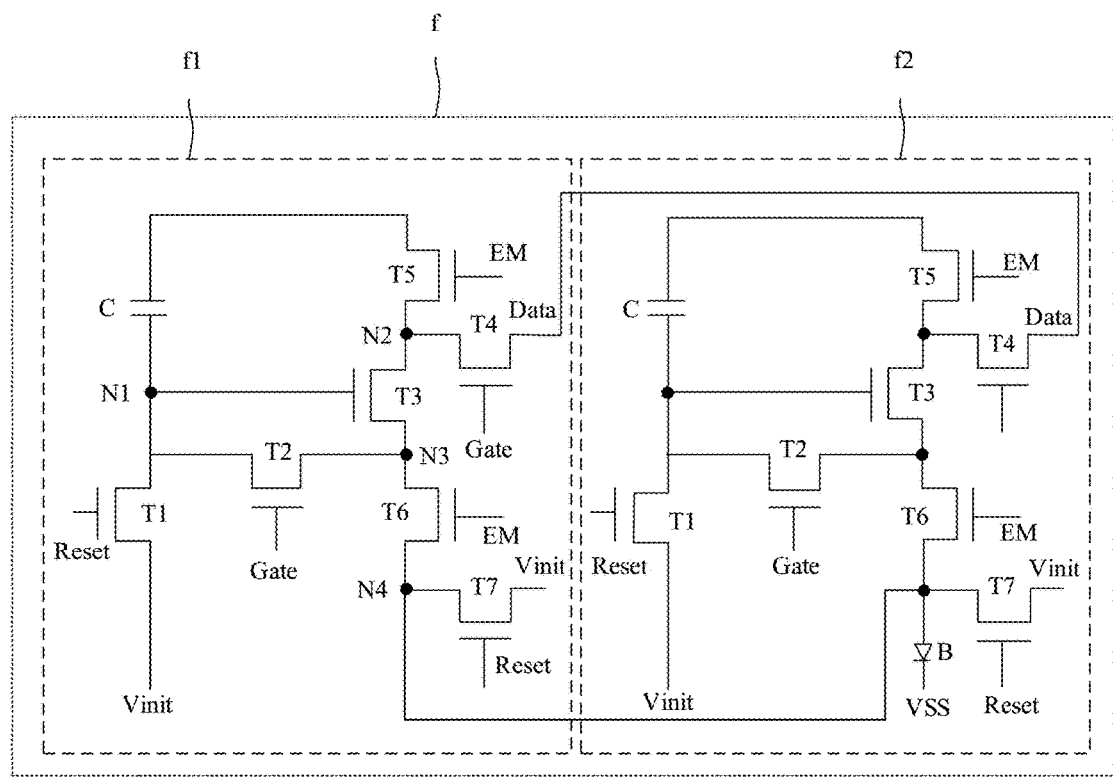
FIG. 36 is an equivalent circuit diagram of a first pixel circuit group or a second pixel circuit group according to some embodiments of the present disclosure.

FIG. 36 is an equivalent circuit diagram of a first pixel circuit group or a second pixel circuit group according to some embodiments of the present disclosure. Referring to FIG. 36, at least two pixel circuits in each of the first pixel circuit groups 103 are configured to be electrically connected to the same first light-emitting unit 102. At least two pixel circuits in each of the second pixel circuit groups 105 are configured to be electrically connected to the same second light-emitting unit 104.

Optionally, the display panel 10 further includes a reset power signal line, a data line, a scanning signal line, a power signal line, a reset control signal line and a light-emission control signal line on the base substrate 101. As shown in FIG. 36, each of the pixel circuits (the first pixel circuits f1 and the second pixel circuits f2) includes a data write transistor T4, a drive transistor T3, a threshold compensation transistor T2, and a first reset control transistor T7. A first electrode of the threshold compensation transistor T2 is connected to a first electrode of the drive transistor T3; a second electrode of the threshold compensation transistor T2 is connected to a gate of the drive transistor T3; a first electrode of the first reset control transistor T7 is connected to the reset power signal line to receive a reset signal Vinit; a second electrode of the first reset control transistor T7 is connected to the light-emitting unit; and a first electrode of the data write transistor T4 is connected to a second electrode of the drive transistor T3. For example, as shown in FIG. 36, the pixel circuit of each pixel unit further includes a storage capacitor C, a first light-emission control transistor T6, a second light-emission control transistor T5 and a second reset transistor T1. A gate of the data write transistor T4 is electrically connected to the scanning signal line to receive a scanning signal Gate. A first electrode of the storage capacitor C is electrically connected to the power signal line, and a second electrode of the storage capacitor C is electrically connected to a gate of the drive transistor 13. A gate of the threshold compensation transistor T2 is electrically connected to the scanning signal line to receive a compensation control signal. A gate of the first reset transistor T7 is electrically connected to the reset control signal line to receive a reset control signal Reset. A first electrode of the second reset transistor T1 is electrically connected to the reset power signal line to receive the reset signal Vinit, a second electrode of the second reset transistor T1 is electrically connected to a gate of the drive transistor T3, and a gate of the second reset transistor T1 is electrically connected to the reset control signal line to receive a reset control signal Reset. A gate of the first light-emission control transistor T6 is electrically connected to the light-emission control signal line to receive a light-emission control signal EM. A first electrode of the second light-emission control transistor T5 is electrically connected to the power signal line, a second electrode of the second light-emission control transistor T5 is electrically connected to a second electrode of the drive transistor T3, and a gate of the second light-emission control transistor T5 is electrically connected to the light-emission control signal line to receive the light-emission control signal EM. The above-mentioned power signal line refers to a signal line for outputting a voltage signal VDD, and is connected to a voltage source to output a constant voltage signal, such as a positive voltage signal.

Optionally, the scanning signal and the compensation control signal are the same. That is, the gate of the data write transistor T3 and the gate of the threshold compensation transistor T2 are electrically connected to the same signal line to receive the same signal, such that the number of signal lines is reduced. For example, the gate of the data write transistor T3 and the gate of the threshold compensation transistor T2 are electrically connected to different signal lines. That is, the gate of the data write transistor T3 is electrically connected to the first scanning signal line, and the gate of the threshold compensation transistor T2 is electrically connected to the second scanning signal line. In some embodiments, signals transmitted by the first scanning signal line and the second scanning signal line are the same or different, such that the gate of the data write transistor T3 and the threshold compensation transistor T2 are controlled separately, thereby increasing the flexibility in controlling the pixel circuit.

Optionally, the light-emission control signals input to the first light-emission control transistor 16 and the second light-emission control transistor T5 are the same. That is, the gate of the first light-emission control transistor T6 and the gate of the second light-emission control transistor T5 are electrically connected to the same signal line to receive the same signal, thereby reducing the number of signal lines. The gate of the first light-emission control transistor T6 and the gate of the second light-emission control transistor T5 are electrically connected to different light-emission control signal lines, and signals transmitted by different light-emission control signal lines are the same or different.

Optionally, the reset control signals input to the first reset transistor T7 and the second reset transistor T1 are the same. That is, the gate of the first reset transistor T7 and the gate of the second reset transistor T1 are electrically connected to the same signal line to receive the same signal, thereby reducing the number of signal lines. For example, the gate of the first reset transistor T7 and the gate of the second reset transistor T1 are electrically connected to different reset control signal lines. In this case, signals over different reset control signal lines are the same or different.

As shown in FIG. 36, when the display panel 10 is working, in a first stage of screen display, the second reset transistor T1 is turned on to initialize the voltage of an N1 node; in a second stage, the same data signal Data is stored in two N1 nodes of two pixel circuits via two connected data write transistors T4, two drive transistors 13 connected to the two connected data write transistors T4, and two threshold compensation transistors T2; in a third stage of light emission, the second light-emission control transistors T5, the drive transistors T3 and the first light-emission control transistors T6 in the two pixel circuits (i.e., the pixel circuit pair f composed of the first pixel circuits f1 and/or the second pixel circuits f2) are all turned on to transmit the same data signal to two N4 nodes. In this case, the N4 nodes of the two pixel circuits are connected to jointly drive the same light-emitting unit B to emit light, thereby increasing current and brightness. The light-emitting unit B is the first light-emitting unit 102 in the first display region 101a, or the second light-emitting unit 104 in the second display region 101b.

It should be noted that, in some embodiments of the present disclosure, in addition to a 7T1C (i.e., seven transistors and one capacitor) structure shown in FIG. 36, the pixel circuit in the pixel circuit groups has a structure including other numbers of transistors, such as a 7T2C structure, a 6T1C structure, a 6T2C structure, or a 9T2C structure, which is not limited in the embodiments of the present disclosure. It is sufficient to only connect the data write transistors T4 of the two pixel circuits and connect the N4 nodes of the two pixel circuits to jointly drive the same light-emitting unit to emit light.

Figure 37:
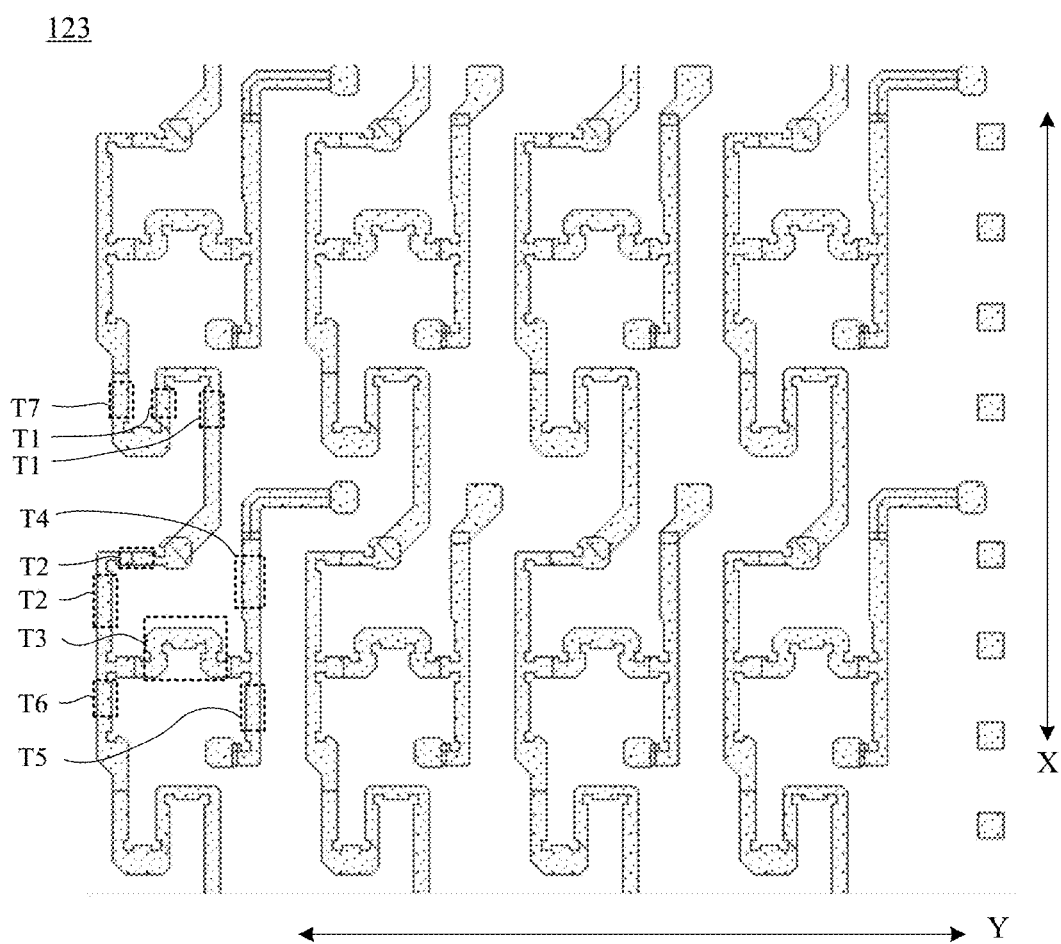
FIG. 37 is a schematic diagram of a partial planar structure of an active semiconductor layer of a pixel circuit in a first display region according to some embodiments of the present disclosure.

FIG. 37 is a partial schematic diagram of an active semiconductor layer of a pixel circuit in a first display region according to some embodiments of the present disclosure. As shown in FIG. 37, the active semiconductor layer 123 is formed by patterning a semiconductor material. The active semiconductor layer 123 is configured to prepare an active layer for the above-mentioned second reset transistor T1, threshold compensation transistor T2, drive transistor T3, data write transistor T4, second light-emission control transistor T5, first light-emission control transistor T6 and first reset control transistor T7. The active semiconductor layer 123 includes an active layer pattern (a channel region) and a doped region pattern (a source-drain doped region) of each transistor in each pixel unit, and the active layer pattern and doped region pattern of each transistor in the same pixel circuit are integrally provided.

It should be noted that the active layer includes an integrally formed low-temperature polysilicon layer, and a source region and a drain region are conductorized by doping or the like to implement the electrical connections of individual structures. That is, the active semiconductor layer 123 of each transistor in each sub-pixel is an overall pattern formed from p-silicon; each transistor in the same pixel circuit includes the doped region pattern (i.e., the source region and drain region) and the active layer pattern; and the active layers of different transistors are separated by doped structures.

For example, the active semiconductor layer 123 is made of amorphous silicon, polysilicon, oxide semiconductor materials or the like. It should be noted that, the above-mentioned source region and drain region are regions doped with n-type impurities or p-type impurities.

Figure 38:
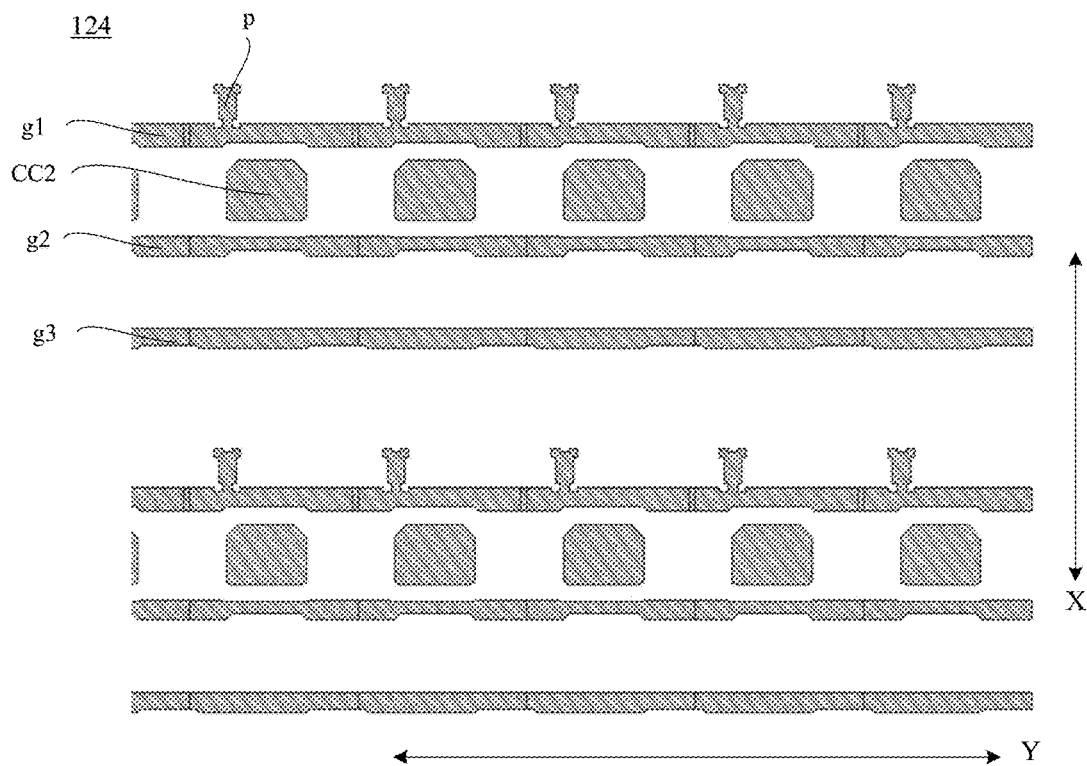
FIG. 38 is a partial schematic diagram of a first conductive layer in a first display region according to some embodiments of the present disclosure.

FIG. 38 is a partial schematic diagram of a first conductive layer in a first display region according to some embodiments of the present disclosure. The display panel includes a gate insulation layer disposed on the side of the active semiconductor layer 123 distal from the base substrate, the gate insulation layer being configured to insulate the above-mentioned active semiconductor layer 123 from a first conductive layer 124 (i.e., a gate metal layer) formed subsequently. FIG. 38 shows the first conductive layer 124 in the display panel. The first conductive layer 124 is disposed on the gate insulation layer to be insulated from the active semiconductor layer 123. The first conductive layer 124 includes a second electrode CC2 of the capacitor C, a plurality of scanning signal lines g1 extending in the second direction Y, a plurality of reset control signal lines g2, and a plurality of light-emission control signal lines g3. The first conductive layer 124 further includes the gates of the second reset transistor T1, threshold compensation transistor T2, drive transistor T3, data write transistor T4, second light-emission control transistor T5, first light-emission control transistor T6, and first reset control transistor gate of transistor T7.

In some embodiments, the gate of the data write transistor T3 is a portion where the scanning signal line g1 is overlapped with the active semiconductor layer 123; and the gate of the first light-emission control transistor T6 is part of a portion where the light-emission control signal line g3 is overlapped with the active semiconductor layer 123, and the gate of the second light-emission control transistor T5 is the other part of the portion where the light-emission control signal line g3 is overlapped with the active semiconductor layer 123. The gate of the second reset transistor T1 is part of a portion where the reset control signal line g2 is overlapped with the active semiconductor layer 123, and the gate of the first reset control transistor T7 is the other part of the portion where the reset control signal line g2 is overlapped with the active semiconductor layer 123. The threshold compensation transistor T2 is a thin-film transistor having a double-gate structure. The first gate of the threshold compensation transistor T2 is a portion where the scanning signal line g1 is overlapped with the active semiconductor layer 123, and the second gate of the threshold compensation transistor T2 is a portion where a protruding structure P protruding from the scanning signal line g1 is overlapped with the active semiconductor layer 123. The gate of the drive transistor T1 is a second electrode CC2 of the capacitor C.

It should be noted that, as to the channel regions of the transistors, the active semiconductor layers 123 on either side of each of the channel regions are conductorized by processes such as ion doping, to serve as the first and second electrodes of the transistors. In some embodiments, the source and drain of each of the transistors are symmetrical in structure, and thus, the source and drain of the transistor are indistinguishable in physical structure. In the embodiments of the present disclosure, for distinguishing the transistors, one electrode therein is directly described as the first electrode and the other electrode is directly described as the second electrode, except for the gates serving as control electrodes. Therefore, the first electrodes and the second electrodes in all or some of the transistors in the embodiments of the present disclosure are interchangeable as required.

Referring to FIG. 38, the scanning signal line g1, the reset control signal line g2, and the light-emission control signal line g3 are disposed in the column direction Y. The scanning signal line g1 is disposed between the reset control signal line g2 and the light-emission control signal line 3.

In the first direction X, the second electrode CC2 (i.e., the gate of the drive transistor T1) of the capacitor C is disposed between the scanning signal line g1 and the light-emission control signal line g3. The protruding structure P protruding from the scanning signal line g1 is disposed on the side of the scanning signal line g1 distal from the light-emission control signal line g3.

A first insulation layer is formed on the above-mentioned first conductive layer 124 for insulating the above-mentioned first conductive layer 124 from the second conductive layer 125 formed subsequently.

Figure 39:
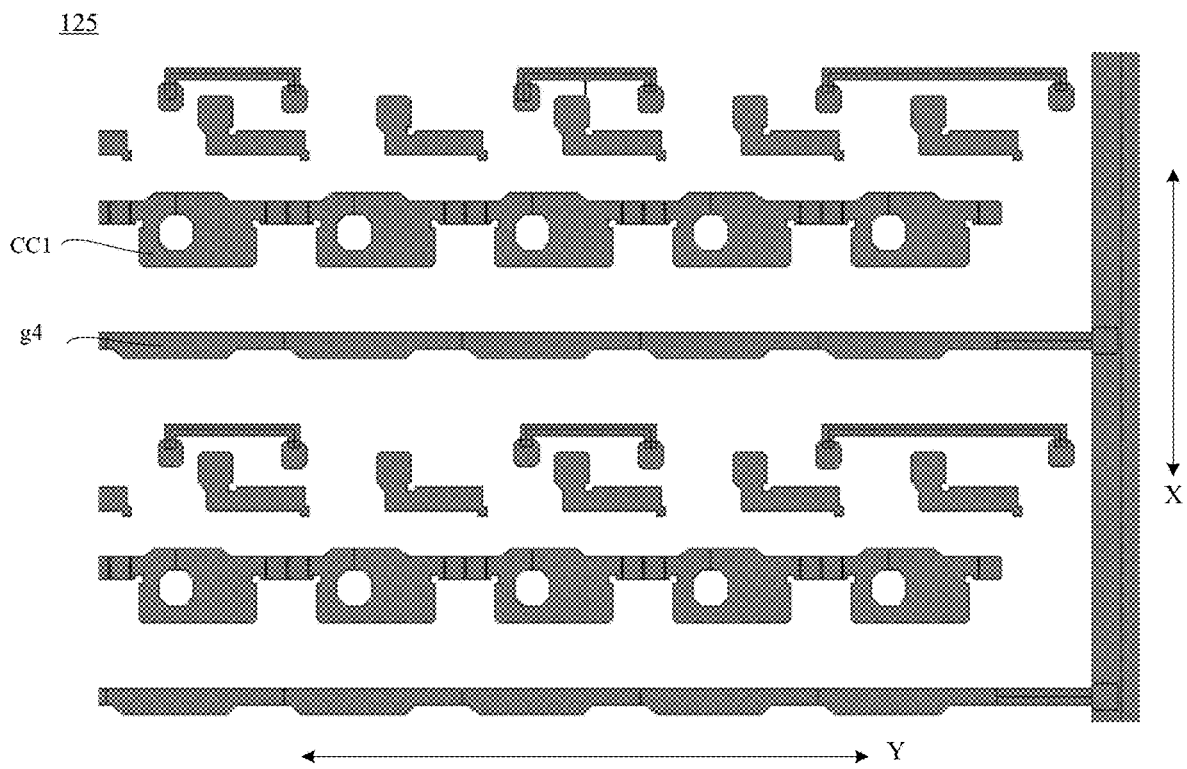
FIG. 39 is a partial schematic diagram of a second conductive layer in a first display region according to some embodiments of the present disclosure.

FIG. 39 is a partial schematic diagram of a second conductive layer in a First display region according to some embodiments of the present disclosure. Referring to FIG. 39, the second conductive layer 125 includes the first electrode CC1 of the capacitor C and a plurality of reset power signal lines g4 extending in the second direction Y. The first electrode CC1 of the capacitor C and the second electrode CC2 of the capacitor C are at least partially overlapped to form the capacitor C.

Optionally, a second insulation layer is formed on the above-mentioned second conductive layer 125 to insulate the above-mentioned second conductive layer 125 from the source-drain metal layer 126 formed subsequently.

Figure 40:
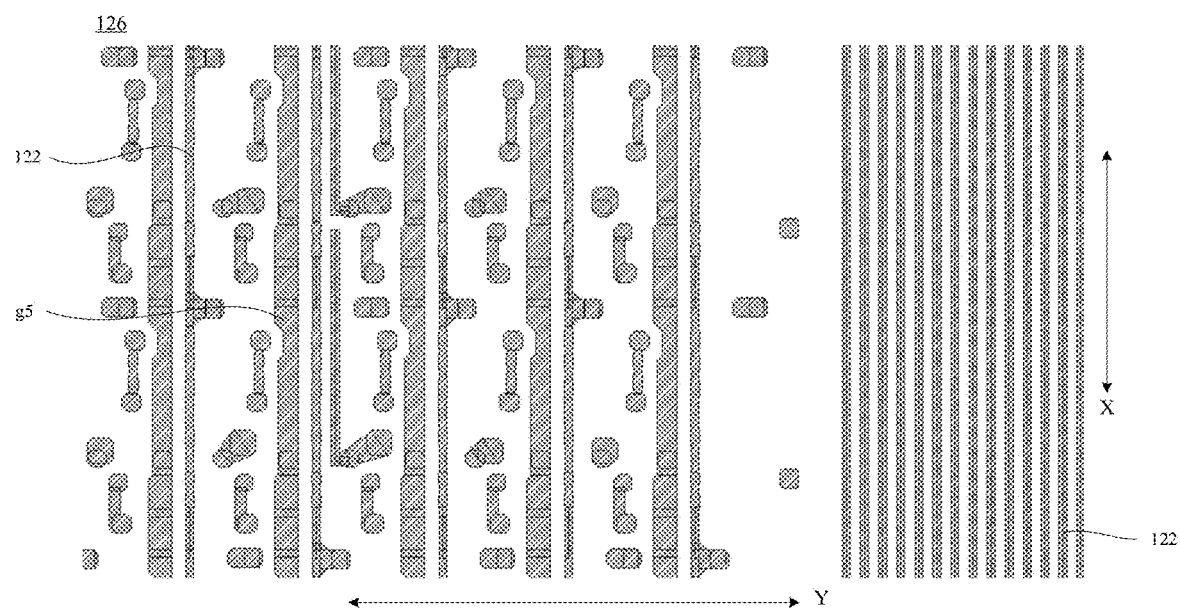
FIG. 40 is a partial schematic diagram of a source-drain metal layer in a first display region according to some embodiments of the present disclosure.
Figure 41:
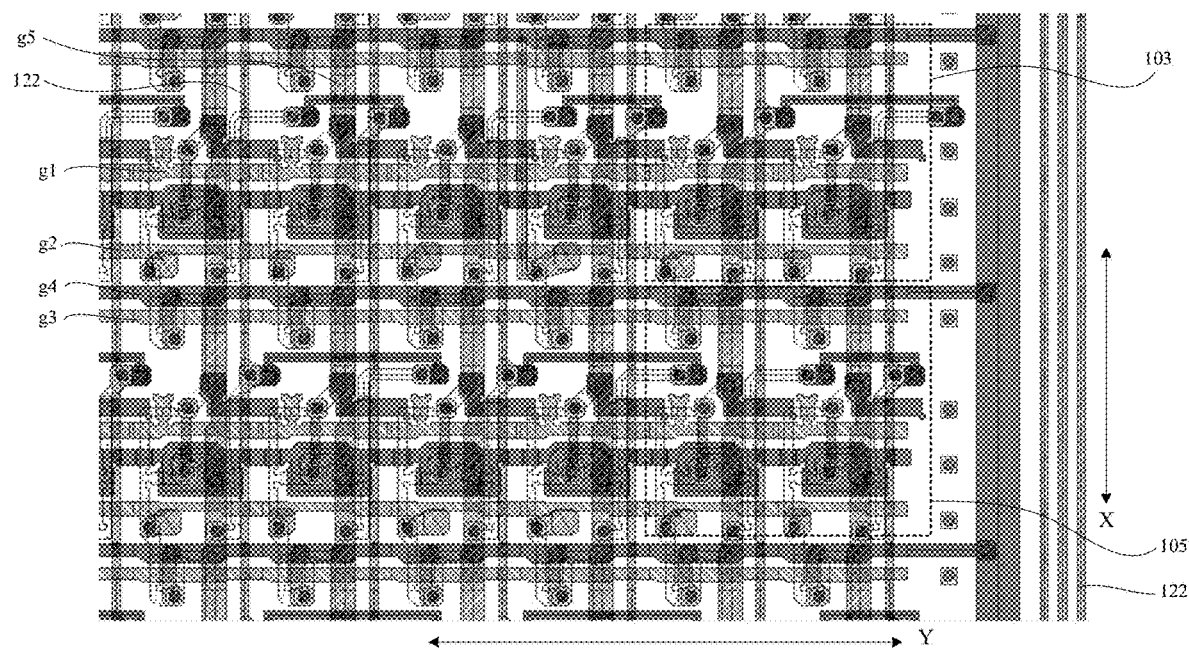
FIG. 41 is a schematic stack-up diagram of an active semiconductor layer, a first conductive layer, a second conductive layer, and a source-drain metal layer in a first display region according to some embodiments of the present disclosure.

FIG. 40 is a partial schematic diagram of a source-drain metal layer in a first display region according to some embodiments of the present disclosure. FIG. 41 is a schematic stack-up diagram of an active semiconductor layer, a first conductive layer, a second conductive layer, and a source-drain metal layer in a first display region according to some embodiments of the present disclosure. Referring to FIG. 40 and FIG. 41, the source-drain metal layer 126 includes data lines 122 and power signal lines g5 extending in the first direction X. The data line 122 is electrically connected to the second electrode of the data write transistor T2 by a via penetrating through the gate insulation layer, the first insulation layer and the second insulation layer. The power signal line g5 is electrically connected to the first electrode of the second light-emission control transistor T5 by a via penetrating through the gate insulation layer, the first insulation layer and the second insulation layer. The power signal lines g5 and the data lines 122 are alternately disposed in the second direction Y. The power signal line g5 is electrically connected to the first electrode CC1 of the capacitor C by a via penetrating through the second insulation layer.

In some embodiments of the present disclosure, a passivation layer and an overcoat are disposed on the side of the source-drain metal layer 126 distal from the base substrate 101 to protect the above-mentioned source-drain metal layer 126.

In some embodiments, referring to FIG. 41, the first pixel circuit group 103 and the second pixel circuit group 105 include two pixel circuits disposed in the second direction Y, i.e., including one pixel circuit pair f. Each of the third pixel circuit groups 120 does not include the above-mentioned pixel circuit pair f (not shown), but only includes one pixel circuit. Two adjacent pixel circuits, disposed in the second direction Y, in the third pixel circuit groups 120 respectively drive one third light-emitting unit 119 to emit light, and two data write transistors in the two adjacent pixel circuits are independent of each other, and connected to different data lines respectively.

In summary, the embodiments of the present disclosure provide a display panel. The first display region in the display panel is provided with dummy electrode patterns, the dummy electrode patterns and the first connection traces being disposed in different layers. In this way, consistent overlap capacitances between regions, where the pixel circuit groups in the first display regions are disposed, and the first connection traces is achieved conveniently, such that the display effect of the display panel is guaranteed.

Figure 42:
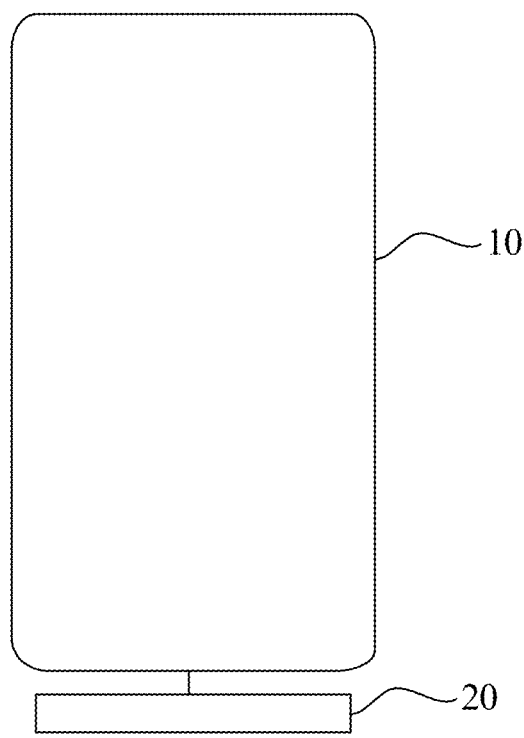
FIG. 42 is a schematic diagram of a structure of a display apparatus according to some embodiments of the present disclosure.

FIG. 42 is a schematic diagram of a structure of a display apparatus according to some embodiments of the present disclosure. Referring to FIG. 42, the display apparatus includes: a power supply assembly 20 and the display panel 10 as defined in the embodiments described above. The power supply assembly 20 is configured to supply power to the display panel 10. The display apparatus is a curved display apparatus.

Optionally, the display apparatus is any product or component having display and fingerprint recognition functions, such as an organic light-emitting diode (OLED) display panel, a piece of electronic paper, a mobile phone, a tablet computer, a television, a display, a notebook computer, a digital photo frame, or a navigator.

Described above are merely exemplary embodiments of the present disclosure, and are not intended to limit the present disclosure. Within the spirit and principles of the present disclosure, any modifications, equivalent substitutions, improvements, and the like are within the protection scope of the present disclosure.

What is claimed is:

1. A display panel, provided with a display region and a non-display region disposed on a periphery of the display region, the display panel comprising:
    a base substrate comprising a first display region and a second display region, the first display region and the second display region being adjacent to each other;
    a plurality of first light-emitting units disposed in the first display region, wherein each of the plurality of first light-emitting unit includes an anode, a light-emitting layer and a cathode sequentially stacked in a direction away from the base substrate, and the plurality of first light-emitting units include a plurality of first light-emitting units of a first color, a plurality of first light-emitting units of a second color and a plurality of first light-emitting units of a third color, at least one first light-emitting unit of the first color, at least one first light-emitting unit of the second color and at least one first light-emitting unit of the third color constitute one light-emitting unit group;
    a plurality of first pixel circuit groups disposed in the first display region, each of the first pixel circuit groups being electrically connected to at least one of the first light-emitting units;
    a plurality of second light-emitting units disposed in the second display region;
    a plurality of second pixel circuit groups disposed in the first display region;
    a plurality of dummy electrode patterns disposed in the first display region, wherein the plurality of dummy electrode patterns are disposed in a same layer as the anode, the plurality of dummy electrode patterns constitute at least one dummy electrode pattern group, the number of the dummy electrode patterns in each dummy electrode pattern group is equal to the number of the first light-emitting units in one light-emitting unit group, the plurality of dummy electrode patterns in each dummy electrode pattern group are in one-to-one correspondence with the plurality of first light-emitting units in one light-emitting unit group, and each dummy electrode pattern in the dummy electrode pattern group has a same shape and area as the anode in the corresponding first light-emitting unit in the light-emitting unit group; and
    a plurality of first connection traces, at least one of the first connection traces having one end electrically connected to at least one of the second light-emitting units, and having the other end electrically connected to the dummy electrode patterns and the second pixel circuit groups;
    wherein the first connection traces and the dummy electrode patterns are disposed in different layers.

2. The display panel according to claim 1, further comprising: a plurality of second connection traces; wherein
    at least one of the second connection traces has one end electrically connected to at least one of the second light-emitting units, and has the other end electrically connected to the dummy electrode patterns and the second pixel circuit groups; and the second connection traces, the first connection traces, and the dummy electrode patterns are disposed in different layers.

3. The display panel according to claim 2, wherein a sum of numbers of the first and second connection traces in the display panel is equal to a number of the dummy electrode patterns, the first connection traces and the second connection traces are in one-to-one correspondence with the dummy electrode patterns, and each of the first and second connection traces is electrically connected to a corresponding dummy electrode pattern of the dummy electrode patterns.

4. The display panel according to claim 2, wherein at least one of the dummy electrode patterns comprises a main body portion and a first connection portion, the first connection portion extending in a first direction, and both the first connection traces and the second connection traces extend in a second direction, the first direction being intersected with the second direction;
wherein the first connection portion is electrically connected, at an intersection of the first connection portion and at least one of the first and second connection traces, to the at least one of the first and second connection traces by a via.

5. The display panel according to claim 4, wherein each of the second pixel circuit groups comprises: a source-drain metal layer disposed on the base substrate, the source-drain metal layer comprising a source and a drain spaced apart; and the display panel further comprises: a first insulation layer, a second insulation layer, and a third insulation layer;
wherein the source-drain metal layer, the first insulation layer, the first connection traces, the second insulation layer, the second connection traces, the third insulation layer, and the dummy electrode patterns are sequentially stacked in a direction going away from the base substrate.

6. The display panel according to claim 2, further comprising: a plurality of second connection portions, wherein the second connection portions extend in a first direction, the first connection traces and the second connection traces both extend in a second direction, and the first direction is intersected with the second direction; and
the second connection portions and the dummy electrode patterns are disposed in different layers, the second connection portions are electrically connected to one of the dummy electrode patterns by a via, and the second connection portions are further electrically connected, at an intersection of the second connections and at least one of the first and second connection traces, to the at least one of the first and second connection traces by a via.

7. The display panel according to claim 6, wherein each of the second pixel circuit groups comprises: a source-drain metal layer disposed on the base substrate, the second connection portions and the source-drain metal layer being disposed in a same layer.

8. The display panel according to claim 6, wherein
an orthographic projection of the intersection on the base substrate is not overlapped with an orthographic projection of any one of the dummy electrode patterns on the base substrate; or
an orthographic projection of the intersection on the base substrate is within an orthographic projection of one of the dummy electrode patterns on the base substrate.

9. The display panel according to claim 2, wherein each of the second pixel circuit groups comprises: a source-drain metal layer disposed on the base substrate, the source-drain metal layer comprising a source and a drain spaced apart; and the display panel further comprises: a first insulation layer, a second insulation layer and a third insulation layer; wherein
the source-drain metal layer, the first insulation layer, the first connection traces, the second insulation layer, the second connection traces, the third insulation layer, and the dummy electrode patterns are sequentially stacked in a direction going away from the base substrate;
the second insulation layer being provided with a plurality of seventh vias and a plurality of eighth vias, and the third insulation layer being provided with a plurality of ninth vias and a plurality of tenth vias, the ninth vias being in one-to-one correspondence with the seventh vias, and the tenth vias being in one-to-one correspondence with the eighth vias; wherein
an orthographic projection of each of the seventh vias on the base substrate is at least partially overlapped with an orthographic projection of the corresponding ninth via on the base substrate, each of the seventh vias is configured to expose one of the first connection traces, and a first electrode of at least one of the second light-emitting units is electrically connected to the first connection trace by the seventh via and the ninth via; and
each of the second connection traces is at least partially disposed within the eighth vias, each of the tenth vias is configured to expose one of the second connection traces, and a first electrode of at least one of the second light-emitting units is electrically connected to the second connection trace by the tenth via.

10. The display panel according to claim 9, wherein the first insulation layer is provided with a plurality of eleventh vias, the second insulation layer is provided with a plurality of twelfth vias, the twelfth vias being in one-to-one correspondence with the eleventh vias; and the third insulation layer is provided with a plurality of thirteenth vias, the thirteenth vias being in one-to-one correspondence with the twelfth vias;
wherein an orthographic projection of each of the eleventh vias on the base substrate is at least partially overlapped with an orthographic projection of the corresponding twelfth via on the base substrate, and an orthographic projection of each of the twelfth vias on the base substrate is at least partially overlapped with an orthographic projection of the corresponding thirteenth via on the base substrate; and
the display panel further comprises: a plurality of first connection patterns and a plurality of second connection patterns, the second connection patterns being in one-to-one correspondence with the first connection patterns;
wherein each of the eleventh vias is configured to expose a drain of a transistor in one of the second pixel circuit groups, and at least part of one of the first connection patterns is electrically connected to the drain by the eleventh via; each of the twelfth vias is configured to expose one of the first connection patterns, and at least part of one of the second connection patterns corresponding to one of the first connection patterns is electrically connected to the first connection pattern by the twelfth via; and each of the thirteenth vias is configured to expose one of the second connection patterns, and at least part of one of the dummy electrode patterns is connected to the second connection pattern by the thirteenth via;

wherein the first connection patterns and the first connection traces are disposed in a same layer, and the second connection patterns and the second connection traces are disposed in a same layer.

11. The display panel according to claim 2, wherein orthographic projections of the first connection traces on the base substrate are not overlapped with orthographic projections of the second connection traces on the base substrate.

12. The display panel according to claim 11, wherein the orthographic projections of the first connection traces on the base substrate and the orthographic projections of the second connection traces on the base substrate are alternately arranged in a second direction of the display panel.

13. The display panel according to claim 1, wherein the base substrate comprises: two first display regions, the two first regions being disposed on either side of the second display region in a first direction; the base substrate further comprises: a first peripheral region and a second peripheral region, the first peripheral region and the second peripheral region being disposed on either side of the two first display regions; the display panel further comprises: a first row-drive circuit disposed in the first peripheral region and a second row-drive circuit disposed in the second peripheral region;

wherein the first row-drive circuit is electrically connected to the first and second pixel circuit groups in one of the first display regions, and the second row-drive circuit is electrically connected to the first and second pixel circuit groups in the other first display region.

14. The display panel according to claim 13, further comprising: a plurality of first scanning signal lines disposed in one of the first display regions, and a plurality of second scanning signal lines disposed in the other first display region; wherein the first row-drive circuit is electrically connected to the first and second pixel circuit groups in one of the first display regions by the first scanning signal lines, and the second row-drive circuit is electrically connected to the first and second pixel circuit groups in the other first display region by the second scanning signal lines, and the first scanning signal lines and the second scanning signal lines are disposed in a same layer, and both orthographic projections of the first scanning signal lines on the base substrate and orthographic projections of the second scanning signal lines on the base substrate are outside the second display region.

15. The display panel according to claim 13, wherein the base substrate further comprises: a third display region disposed on a same side as the first display regions and the second display region; the first peripheral region and the second peripheral region are disposed on either side of the third display region in a first direction; the display panel further comprises: a plurality of third light-emitting units disposed in the third display region, and a plurality of third pixel circuit groups connected to the third light-emitting units in one-to-one correspondence; and the first row-drive circuit and the second row-drive circuit are both connected to the third pixel circuit groups in the third display region.

16. The display panel according to claim 1, wherein a shape of the second display region is a rectangle; the display panel further comprises: a plurality of data lines;

wherein an orthographic projection of a portion, disposed in the second display region, of each of the data lines on the base substrate is a straight line or a broken line, and is within a region of the second display region close to the first display region.

17. The display panel according to claim 1, wherein each of the second light-emitting units comprises: a first electrode, a light-emitting layer and a second electrode, which are sequentially stacked in a direction going away from the base substrate;

wherein the dummy electrode patterns and the first electrode are disposed in a same layer.

18. The display panel according to claim 1, wherein an orthographic projection of each of the dummy electrode patterns on the base substrate is at least partially overlapped with an orthographic projection of at least one of the second pixel circuit groups on the base substrate, and the orthographic projection of each of the dummy electrode patterns on the base substrate is not overlapped with an orthographic projection of any one of the first light-emitting units on the base substrate.

19. The display panel according to claim 1, wherein an orthographic projection of a connection of each of the dummy electrode patterns and the second pixel circuit groups on the base substrate is not overlapped with orthographic projections of a plurality of first connection traces on the base substrate, and not overlapped with orthographic projections of a plurality of second connection traces on the base substrate.

20. A display apparatus, comprising: a power supply assembly and a display panel, wherein the power supply assembly is configured to supply power to the display panel; and the display panel comprises:

a base substrate comprising a first display region and a second display region, the first display region and the second display region being adjacent to each other;

a plurality of first light-emitting units disposed in the first display region, wherein each of the plurality of first light-emitting unit includes an anode, a light-emitting layer and a cathode sequentially stacked in a direction away from the base substrate, and the plurality of first light-emitting units include a plurality of first light-emitting units of a first color, a plurality of first light-emitting units of a second color and a plurality of first light-emitting units of a third color, at least one first light-emitting unit of the first color, at least one first light-emitting unit of the second color and at least one first light-emitting unit of the third color constitute one light-emitting unit group;

a plurality of first pixel circuit groups disposed in the first display region, each of the first pixel circuit groups being electrically connected to at least one of the first light-emitting units;

a plurality of second light-emitting units disposed in the second display region;

a plurality of second pixel circuit groups disposed in the first display region;

a plurality of dummy electrode patterns disposed in the first display region, wherein the plurality of dummy electrode patterns are disposed in a same layer as the anode, the plurality of dummy electrode patterns constitute at least one dummy electrode pattern group, the number of the dummy electrode patterns in each dummy electrode pattern group is equal to the number of the first light-emitting units in one light-emitting unit group, the plurality of dummy electrode patterns in each dummy electrode pattern group are in one-to-one correspondence with the plurality of first light-emitting units in one light-emitting unit group, and each dummy electrode pattern in the dummy electrode pattern group has a same shape and area as the anode in the corresponding first light-emitting unit in the light-emitting unit group; and a plurality of first connection traces, at least one of the first connection traces having one end electrically connected to at least one of the second light-emitting units, and having the other end electrically connected to the dummy electrode patterns and the second pixel circuit groups;

wherein the first connection traces and the dummy electrode patterns are disposed in different layers.

* * * * *